US012626885B2

(12) United States Patent　　　　　(10) Patent No.:　US 12,626,885 B2
Colvin et al.　　　　　　　　　　　　　(45) Date of Patent:　May 12, 2026

(54) WIRE OR ROD SHAPED EXTRACTION ELECTRODE OPTICS

(71) Applicant: Axcelis Technologies, Inc., Beverly, MA (US)

(72) Inventors: Neil Colvin, Merrimack, NH (US); Paul Silverstein, Arlington, MA (US); Joshua Abeshaus, Salem, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 548 days.

(21) Appl. No.: 17/977,537

(22) Filed: Oct. 31, 2022

(65) Prior Publication Data

US 2024/0145213 A1　　May 2, 2024

(51) Int. Cl.
　　*H01J 37/063*　　(2006.01)
　　*H01J 37/317*　　(2006.01)
(52) U.S. Cl.
　　CPC ........ *H01J 37/3171* (2013.01); *H01J 37/063* (2013.01)
(58) Field of Classification Search
　　None
　　See application file for complete search history.

(56) References Cited

U.S. PATENT DOCUMENTS 3,908,123 A　　9/1975　Veach et al.
9,831,070 B1 *　11/2017　Hammen ................ H01T 19/00

10,573,485 B1 *　2/2020　Platow .................... H01J 37/08
2010/0171042 A1 *　7/2010　Kellerman .......... H01J 37/1471
　　　　　　　　　　　　　　　　　　　　　　250/396 R
2011/0309265 A1 *　12/2011　Babinec ................ G01N 21/64
　　　　　　　　　　　　　　　　　　　　　　250/459.1
2014/0034843 A1　　2/2014　Oliver et al.
(Continued)

FOREIGN PATENT DOCUMENTS

JP　　　H0195452 A　　4/1989
JP　　　02239559 A　 *　9/1990
(Continued)

OTHER PUBLICATIONS

International Search Report dated Jan. 18, 2024, for International Application No. PCT/US2023/036037.

*Primary Examiner* — James Choi
(74) *Attorney, Agent, or Firm* — Eschweiler & Potashnik, LLC

(57)　　　　　　ABSTRACT
An electrode apparatus for an ion implantation system has a base plate having a base plate aperture and at least one securement region. A securement apparatus is associated with each securement region, and a plurality of electrode rods are selectively coupled to the base plate by the securement apparatus. The plurality of electrode rods have a predetermined shape to define an optical region that is associated with the base plate aperture. An electrical coupling electrically connects to the plurality of electrode rods and is configured to electrically connect to an electrical potential. The plurality of electrode rods have a predetermined shape configured to define a path of a charged particle passing between the plurality of electrode rods based on the electrical potential. The plurality of electrode rods can define a suppressor or ground electrode downstream of an extraction aperture of an ion source.

20 Claims, 15 Drawing Sheets

(56) References Cited

U.S. PATENT DOCUMENTS

| | | |
|---|---|---|
| 2018/0138007 A1 | 5/2018 | Hahto et al. |
| 2021/0005421 A1 | 1/2021 | Peitzsch |

FOREIGN PATENT DOCUMENTS

| | | | | |
|---|---|---|---|---|
| JP | H02239559 A | 9/1990 | | |
| JP | 2000171599 A | 6/2000 | | |
| JP | 2012195177 A | 10/2012 | | |
| KR | 1366512 B1 * | 2/2014 | ............ | H01J 37/026 |
| TW | 201407656 A | 2/2014 | | |

* cited by examiner

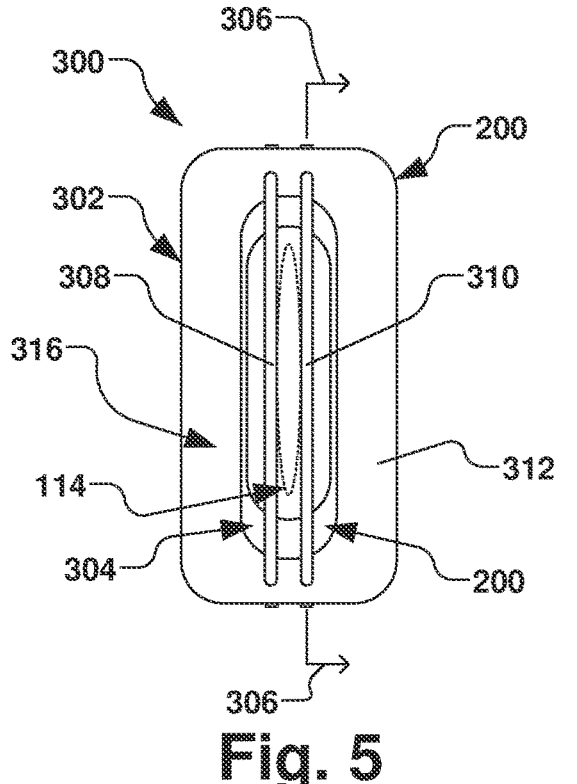
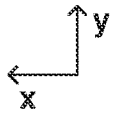
Fig. 5
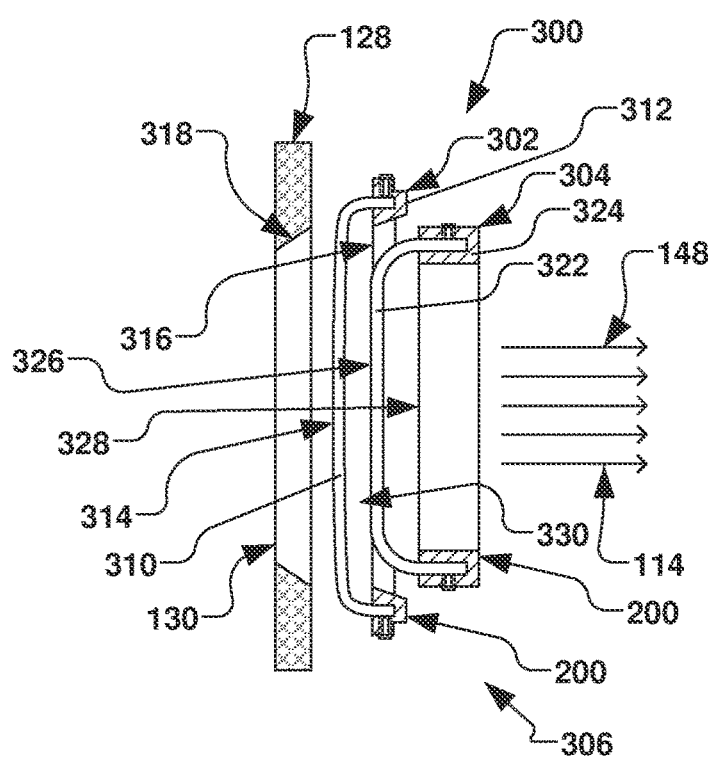
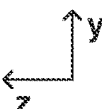
Fig. 6

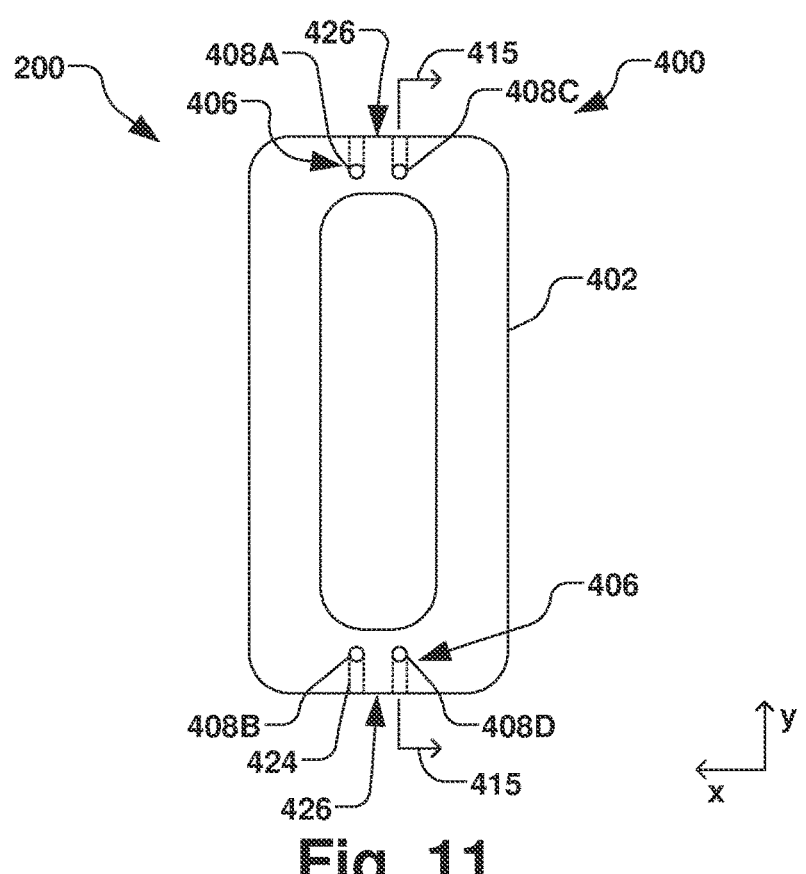
Fig. 11
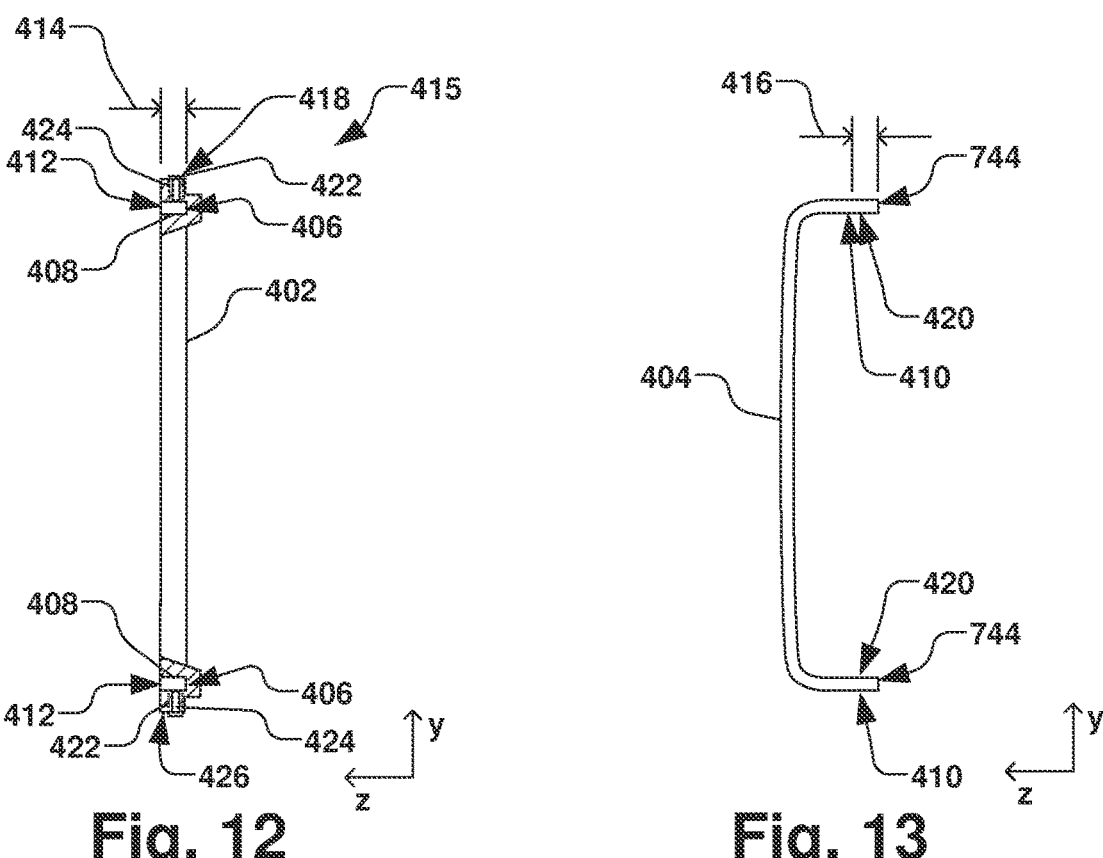
Fig. 12          Fig. 13

WIRE OR ROD SHAPED EXTRACTION ELECTRODE OPTICS

FIELD OF THE INVENTION

The present invention relates generally to ion implantation systems and more specifically to an ion source having an ion source having extraction electrode optics that are rod-shaped to reduce cost and maintenance issues associated with replacement of the extraction electrode optics.

BACKGROUND OF THE INVENTION

In the manufacture of semiconductor devices and other ion related products, ion implantation systems are used to impart dopant elements into semiconductor wafers, display panels, or other types of workpieces. Typical ion implantation systems or ion implanters impact a workpiece with an ion beam utilizing a known recipe or process in order to produce n-type or p-type doped regions, or to form passivation layers in the workpiece. When used for doping semiconductors, the ion implantation system injects selected ion species to produce the desired extrinsic material. Typically, dopant atoms or molecules are ionized and isolated, sometimes accelerated or decelerated, formed into a beam, and implanted into a workpiece. The dopant ions physically bombard and enter the surface of the workpiece, and subsequently come to rest below the workpiece surface in the crystalline lattice structure thereof.

Ion implantation has become the technology preferred by industry to dope semiconductors with impurities in the large-scale manufacture of integrated circuits. Ion dose and ion energy are the two most important variables used to define an implant step. Ion dose relates to the concentration of implanted ions for a given semiconductor material. Typically, high current implanters (generally greater than 10 milliamperes (mA) ion beam current) are used for high dose implants, while medium current implanters (generally capable of up to about 10 mA beam current) are used for lower dose applications.

Ion energy is the dominant parameter used to control junction depth in semiconductor devices. The energy levels of the ions that make up the ion beam determine the degree of depth of the implanted ions. High energy processes such as those used to form retrograde wells in semiconductor devices require implants of up to a few million electron-volts (MeV), while shallow junctions may demand ultra low energy (ULE) levels below one thousand electron-volts (1 keV).

A typical ion implanter comprises four sections or subsystems: (i) an ion source for generating an ion beam, (ii) an ion beam extraction system, (iii) a beamline including a mass analysis magnet for mass resolving the ion beam, and (iv) a target chamber which contains the semiconductor wafer or other substrate to be implanted by the ion beam. The continuing trend toward smaller and smaller semiconductor devices is driving beamline constructions to deliver high beam currents at low energies. High beam currents provide the desired dosage levels, while low energies permit shallow implants. Source/drain extensions in CMOS devices, for example, make it desirable for such a high current, low energy application.

Ion sources in ion implanters typically generate an ion beam by ionizing a source gas containing a desired dopant element within an ion source chamber, and an extraction system extracts the ionized source gas in the form of an ion beam. The ionization process is effected by an electron beam, which may take the form of a thermionic emitter such as a thermally heated filament, or a radio frequency (RF) antenna. A thermionic emitter is typically electrically biased so that emitted electrons gain sufficient energy to ionize, while an RF antenna delivers a high energy RF signal into the source chamber to energize ambient electrons.

The high-energy electrons thus ionize the source gas in the ion source chamber to generate desired ions. Examples of desired dopant ions produced from the source gas may include boron (B), phosphorous (P) or arsenic (As). In an ion source utilizing a thermionic emitter for ionization, the local emitter temperature typically exceeds 2500° C., and the source chamber being thermally irradiated by the emitter may attain temperatures on the order of 700° C.

FIG. 1 illustrates a conventional extraction electrode system 10, whereby ions generated within an ion source 12 are extracted through a source aperture 14 to generally define an ion beam (not shown). The conventional extraction electrode system 10 comprises an extraction electrode 16 that is electrically biased with respect to the ion source 12 and a ground electrode 18 that is electrically grounded. Typically, the extraction electrode 16 electrode and the ground electrode 18 have a respective focusing slits 20, 22 that are defined in respective solid plate members 24, 26.

In designing an ion implanter, it is desirable for the ion beam to accurately follow a desired predetermined beam path. The precise position of the extraction electrode 16 with respect to the source aperture 14, for example, is important to ensure that the ion beam follows the desired predetermined beam path. Thus, precise alignment and positioning of the various electrodes or optics of the extraction electrode system 10 with the source aperture 14 is typically desired.

The present disclosure appreciates that conventional extraction electrode assembly optics are considered consumable parts due to wear from ion beam sputtering. For example, the extraction electrode 16 has a forward-facing surface 28 that faces the source aperture 14 of the ion source 12, and the ground electrode 18 has a forward-facing surface 30 that faces a downstream side 32 of the extraction electrode 16. Accordingly, the forward-facing surfaces 28, 30 tend to erode from exposure of the ions extracted from the ion source 12, whereby the focusing slits 20, 22 of the respective extraction electrode 16 and ground electrode 18 tend to widen or open over time. Such erosion due to sputtering and etching from the ion beam deleteriously affects the optical properties of the extraction electrode system 10.

Since conventional electrodes such as those described above are typically machined or otherwise formed from a solid block of tungsten or graphite, manufacture costs of such electrodes is typically high. In many instances, due to the high costs involved, attempts are often made to re-use, clean, or modify the conventional electrodes over time, thus leading to deleterious variations in optics, beam transport, and performance of the implantation system.

SUMMARY OF THE INVENTION

The present invention overcomes various limitations of the prior art by providing an extraction electrode apparatus for an ion source, wherein the extraction electrode apparatus comprises a plurality of rod-shaped optical elements. The rod-shaped optical elements provide for a cost effective ion implant system by reducing system maintenance costs. Accordingly, the following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

The present invention is generally directed to electrode components of an ion implantation that may be easily replaced and/or maintained in an ion implantation system. However, the present disclosure is applicable to any system or apparatus where one or more charged particles are extracted, accelerated, decelerated, focused, guided, and/or shaped in one or more dimensions, as well as prevented from passing through one or more electrode components.

In accordance with one example aspect of the present disclosure, an electrode apparatus for an ion implantation system is provided, wherein the electrode apparatus comprises a base plate having a base plate aperture defined therein, and wherein the base plate comprises at least one securement region. A securement apparatus, for example, is associated with each of the at least one securement region, and a plurality of electrode rods are selectively coupled to the base plate via the securement apparatus. The plurality of electrode rods, such as a pair of electrode rods, for example, have a predetermined shape to define an optical region therebetween, wherein the optical region is associated with the base plate aperture. An electrical coupling, for example, is further electrically coupled to the pair of electrode rods and configured to electrically connect to an electrical potential. The pair of electrode rods, for example, have a predetermined shape configured to define a characteristic of a charged particle passing between the pair of electrode rods based on the electrical potential. The characteristic, for example, can comprise a path, shape, and/or energy of the charged particle.

Each of the pair of electrode rods, for example, can respectively comprise an optical portion and one or more mounting portions, wherein the securement apparatus selectively engages the one or more mounting portions to locate the optical portion of each of the pair of electrode rods at a predetermined position with respect to the base plate. The one or more mounting portions, for example, can be associated with a respective first end and second end of each of the pair of electrode rods. The one or more mounting portions can comprise a respective elongate leg portion extending from the optical portion of each of the pair of electrode rods.

The base plate, for example, can comprise a respective base hole configured to receive each respective elongate leg portion in the at least one securement region. The securement apparatus, for example, can comprise an electrode fastener associated with at least one elongate leg portion of each electrode rod, respectively, wherein the electrode fastener is configured to respectively selectively secure the at least one elongate leg portion to the base plate. The electrode fastener, for example, can comprise a threaded screw such as a set screw.

In one example, each respective base hole is a blind hole having a predetermined depth, wherein the predetermined depth defines the predetermined position of the optical portion of each of the pair of electrode rods with respect to the base plate.

In another example, the securement apparatus comprises a mounting plate, wherein the one or more mounting portions of each of the pair of electrode rods are selectively coupled to the one or more mounting plates, and wherein the one or more mounting plates are selectively coupled to the base plate in the at least one securement region. The one or more mounting plates, for example, can comprise a respective mounting hole configured to respectively receive one or more of the respective first end and second end of each of the pair of electrode rods, wherein the securement apparatus comprises an electrode fastener associated with at least one elongate leg portion of each electrode rod, respectively. The electrode fastener, for example, is thus configured to respectively selectively secure at least one elongate leg portion to the mounting plate, respectively, wherein the securement apparatus further comprises at least one mounting plate fastener configured to selectively secure the mounting plate to the base plate.

The base plate, for example, can comprise at least one threaded base hole configured to respectively receive the at least one mounting plate fastener, wherein the at least one mounting plate fastener comprises a screw, such as a set screw.

In another example, the optical portion of each of the pair of electrode rods is respectively curvilinear. The pair of electrode rods, for example, can be parallel to one another when viewed along the path of the charged particle. Each of the pair of electrode rods, for example, can be comprised of one or more of a refractory metal and graphite. Further, the base plate can be comprised of one or more of a refractory metal and graphite.

In yet another example, the pair of electrode rods can be configured to define a suppressor electrode positioned downstream of an extraction aperture of an ion source, wherein the electrical potential is a predetermined non-zero voltage. The pair of electrode rods can further define a ground electrode in another example, wherein the electrical potential is a source of electrical ground. The pair of electrode rods, for example, can be comprised of one of tungsten, tantalum, molybdenum or graphite.

In accordance with another example, an electrode assembly for an ion implantation system is provided, wherein the electrode assembly comprise a base plate and a plurality of rods selectively operatively coupled to the base plate. The plurality of rods, for example, are separated from one another by a predetermined distance, wherein the predetermined distance is associated with a width of an ion beam extracted from an ion source.

In yet another example of the present disclosure, an electrode assembly is provided for controlling an ion beam in an ion implantation system. The electrode assembly, for example, comprises a base plate, one or more electrode rods, and a securement apparatus. The one or more electrode rods, for example, are defined by one or more predetermined shapes, wherein the one or more predetermined shapes are associated with a desired characteristic of the ion beam. Further, the securement apparatus is configured to selectively couple the one or more electrode rods to the at least one securement region of the base plate to maintain a position of the one or more electrode rods with respect to the ion beam.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 5 illustrates a front plan view of an extraction electrode apparatus according to various examples of the present disclosure.

FIG. 6 illustrates a cross-sectional side view of the extraction electrode apparatus of FIG. 5 in accordance with various examples of the present disclosure.

FIG. 11 illustrates a front plan view of a suppression electrode base plate according to various examples of the present disclosure FIG. 12 illustrates a cross-sectional side view of the suppression electrode base plate of FIG. 11 in accordance with various examples of the present disclosure.

FIG. 13 illustrates a side view of a suppression electrode rod according to various examples of the present disclosure.

DETAILED DESCRIPTION OF THE INVENTION

Figure 1:
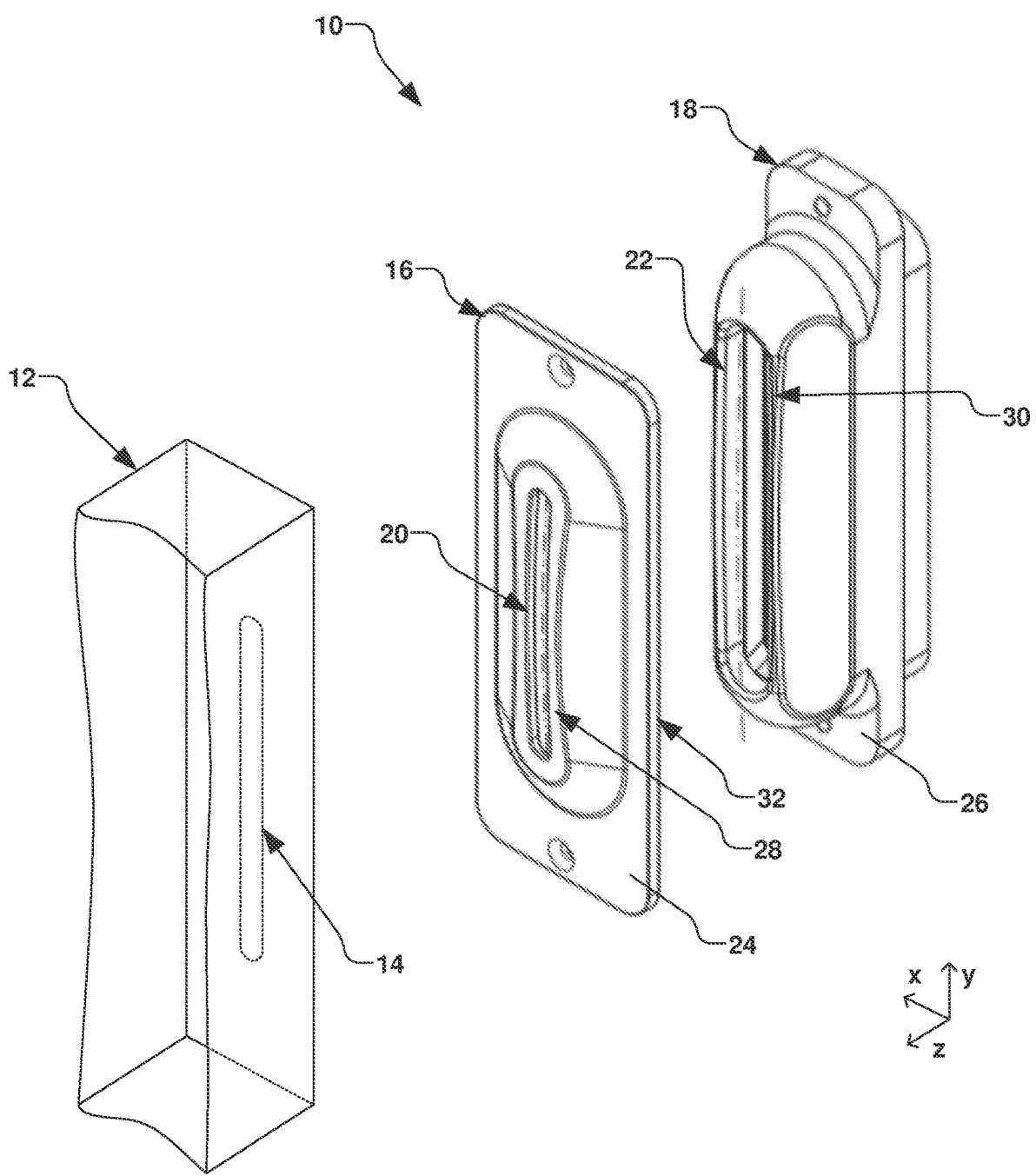
FIG. 1 illustrates a blown-up perspective view of a conventional optic system for an ion implantation system.

The present disclosure is directed generally towards an electrode apparatus for use in an ion implantation system. More particularly, an extraction electrode apparatus is configured to efficiently extract a charged particle from an ion source while providing lower maintenance costs by providing replaceable rod-shaped extraction electrodes.

Accordingly, the present invention will now be described with reference to the drawings, wherein like reference numerals are used to refer to like elements throughout. It should be understood that the description of these aspects are merely illustrative and that they should not be taken in a limiting sense. In the following description, for purposes of explanation, numerous specific details are set forth in order to provide a thorough understanding of the present invention. It will be evident to one skilled in the art, however, that the present invention may be practiced without these specific details.

Figure 2:
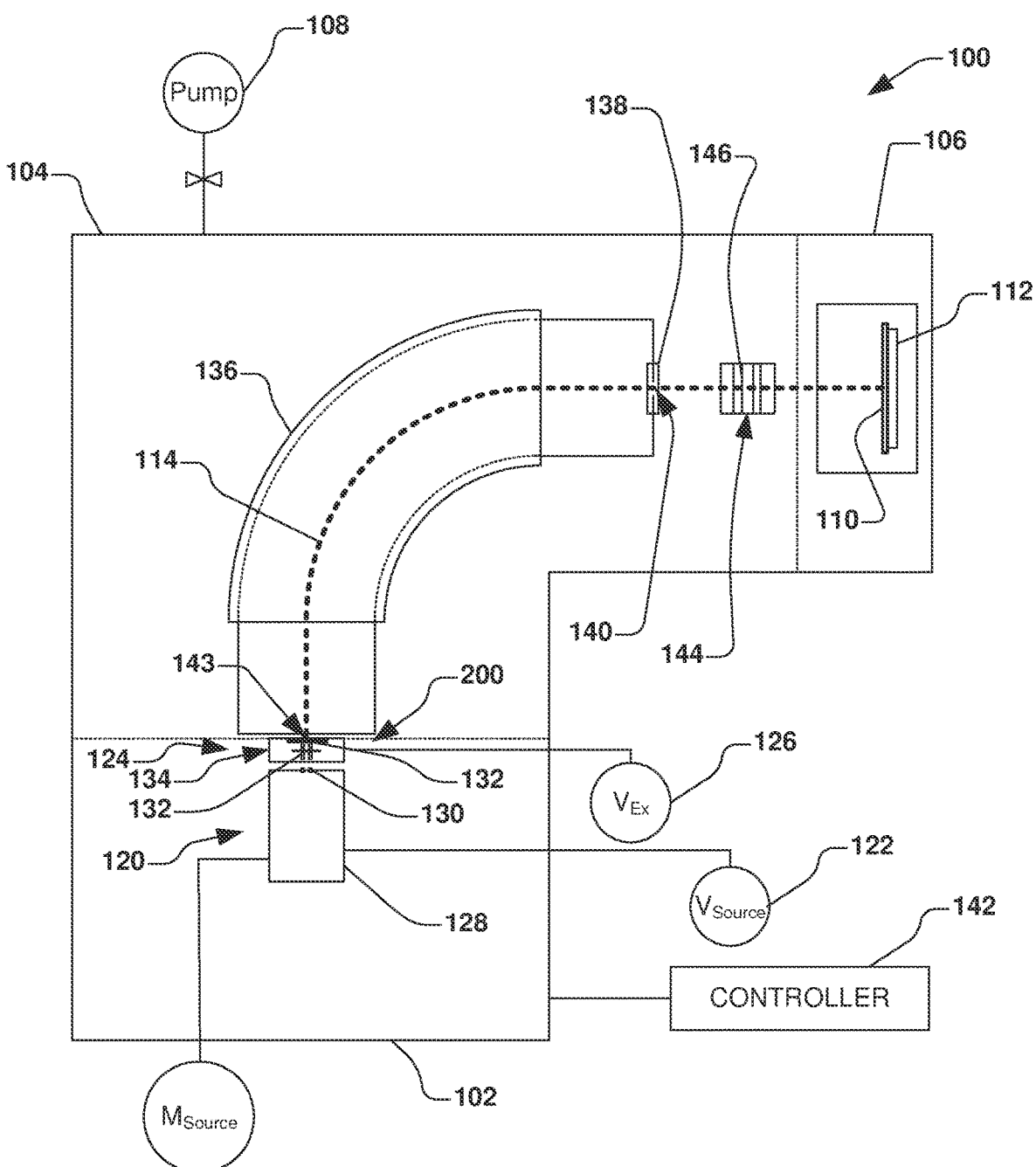
FIG. 2 illustrates a schematic view of an ion implantation system according to various examples of the present disclosure.

Referring now to the Figures, in order to gain a better understanding of the disclosure, exemplary ion implantation system 100 is schematically illustrated in FIG. 2, wherein the exemplary ion implantation system is suitable for implementing one or more aspects of the present invention. It should be noted that although the ion implantation system 100 is illustrated as one example, the present invention can be practiced using various other types of ion implantation apparatus and systems, such as high energy systems, low energy systems, or other implantation systems, and all such systems are contemplated as falling within the scope of the present invention.

The ion implantation system 100 of FIG. 2, for example, comprises a terminal 102, a beamline assembly 104, and an end station 106 (e.g., comprising a process chamber), wherein the ion implantation system is generally placed under vacuum by one or more vacuum pumps 108. The ion implantation system 100, for example, is configured to implant ions into a workpiece 110 (e.g., a semiconductor wafer, display panel, etc.). In one example, the ion implantation system 100 is configured to implant ions into a single workpiece 110 (e.g., a "serial" ion implanter), wherein the workpiece generally resides on a support 112 (e.g., a pedestal or electrostatic chuck) situated within the end station 106. Alternatively, the ion implantation system 100 is configured to implant ions into multiple workpieces 110 (e.g., a "batch" ion implanter), wherein the end station 106 comprises a rotating disk (not shown), whereon several workpieces are translated with respect to an ion beam 114. It should be noted that any ion implantation apparatus operable to extract ions from an ion source and implant them into one or more workpieces is contemplated as falling within the scope of the present invention.

The terminal 102, for example, comprises an ion source 120 powered by a source power supply 122 ($V_{source}$) that defines the energy of extracted ions, and an extraction assembly 124 powered by an extraction power supply 126 ($V_{Ex}$) to extract ions from the ion source via an extraction voltage $V_{Extract}$. The extraction assembly 124, in conjunction with the beamline assembly 104, for example, is operable to direct the ions toward the workpiece 110 residing on the support 112 in the end station 106 for implantation thereof at a given energy level.

In one example, the ion source 120 biased at potential $V_{source}$ comprises a plasma chamber 128 (also called an arc chamber) wherein ions of a process material $M_{source}$ are generated at relatively high plasma densities (e.g., $10^{10}$ to $10^{13}$ cm$^{-3}$). It should be noted that generally, positive ions are generated, although the present invention is also applicable to systems wherein negative ions are generated by the ion source 120. The extraction assembly 124 further comprises an extraction aperture 130 (also called an arc slit) defined in a wall of the plasma chamber 128, as well as one or more extraction electrodes 132, wherein the extraction aperture is biased to the extraction potential $V_{source}$. The extraction voltage $V_{Extract}$ is defined by the potential $V_{source}$ and the voltage $V_{Ex}$ applied to extraction electrodes, thereby providing the extracted ion beam 114 to the beamline assembly 104. In one example, if an ion energy of 120 keV is desired, $V_{source}$=120 kV with respect to the workpiece 110, when the workpiece is grounded. The extraction assembly 124 and configuration thereof is discussed in further detail infra.

In accordance with the disclosure, a first of the one or more extraction electrodes 132 comprises a suppression electrode. When the suppression electrode is at a suppression potential, for example, the extraction voltage $V_{Extract}$ may be defined as the difference of the potentials of the extraction power supply 126 ($V_{Ex}$) and source power supply 122 ($V_{source}$). In another example, when the first electrode is grounded, the extraction voltage $V_{Extract}$ may be defined as the potential of the source power supply 122. It will be understood that various other configurations of the one or more extraction electrodes 132 and electrical connections thereto are contemplated as falling within the scope of the present disclosure.

If positive ions are generated, the one or more extraction electrodes 132, for example, are biased at a voltage less than $V_{source}$ (e.g., an extraction voltage of 0-100 kV). The negative relative potential at the one or more extraction electrodes 132 with respect to the extraction electrode creates an electrostatic field between the extraction aperture 130, whereby the one or more extraction electrodes are operable to extract and accelerate the positive ions out of the ion source 120. Accordingly, the one or more extraction electrodes 132, for example, define extraction electrode optics 134 through which the ion beam 114 passes, wherein the extraction electrode optics are configured to extract the ions from the ion source 120.

The beamline assembly 104 of the ion implantation system 100, for example, further comprises a mass analyzer 136 that receives the extracted ion beam 114 and a resolving plate 138, wherein the mass analyzer generally creates a dipole magnetic field to significantly pass only ions of appropriate charge-to-mass ratio or range thereof (e.g., a mass analyzed ion beam having ions of a desired mass range) to the workpiece 110 positioned in the end station 106.

The resolving plate 138, for example, operates in conjunction with the mass analyzer 136 in order to eliminate undesirable ion species from the ion beam 114 that have a different charge-to-mass ratio from the charge-to-mass of the desired species of ions. The resolving plate 138, for example, includes one or more resolving apertures 140 through which the ions in the ion beam 114 pass. At the resolving plate 138, a dispersion of desired ions is generally at its minimum value.

In one example, the strength and orientation of the magnetic field of the mass analyzer 136, as well as the velocity of the ions extracted from the ion source 120, is established by a controller 142, such that, in general, only ions having a mass equal to the mass of the desired species will be passed to the end station 106. The controller 142, in one example, is operable to control various aspects the ion implantation system 100. The controller 142, for example, is operable to control the source power supply 122 for producing the ions, as well as the extraction power supply 126. It will be appreciated that the controller 142 may comprise a processor, computer system, and/or operator for overall control of the system 100 (e.g., a computer system in conjunction with input by an operator).

In accordance with one example aspect of the present disclosure, the one or more extraction electrodes 132 have one or more electrode apertures 143 associated therewith, wherein positively charged ions exit the plasma chamber 128 of the ion source 120 through the extraction aperture 130 and the one more electrode apertures form and/or focus the ion beam 114. During operation of the ion implantation system 100, it is appreciated that the extraction electrode optics 134 can experience wear caused by the ion beam 114, thereby degrading the stability and efficiency of ion beam transport, and thus contributing to so-called beam noise, and variabilities in a width and/or height of the ion beam. The present disclosure appreciates that the extraction electrode optics 134 are considered consumable parts due to such wear.

In another example, in a region downstream of the mass analyzer 136, an angular energy filter (AEF) 144 may be further provided in the ion implantation system 100. The AEF 144, for example, can comprise one or more AEF electrodes 146 or other features configured to receive the ion beam 114 and subsequently deflect the ion beam 114 from an incoming beamline axis. Over time, the AEF electrodes 146, for example, can also be subject to wear caused by the ion beam 114 in a manner similar to that of the extraction electrode optics 134.

Maintenance of the ion implantation system 100, for example, can include disassembly, cleaning, and/or replacement of various components situated along a beamline 148 of the ion implantation system, such as the extraction electrode optics 134 and AEF electrodes. The present disclosure appreciates that it is desirable to have repeatable, precise alignment of the various components after such maintenance in order to achieve reproducible implants. For example, an alignment of extraction electrodes 132 with the ion source 120, or an alignment of the AEF electrodes 146 along the beamline 148 can play a significant role in the stability and efficiency of transport of the ion beam 114. The present disclosure advantageously provides an architecture for various electrode apparatuses within the ion implantation system 100, whereby repeatable and accurate alignment (e.g., with respect to the beamline 148) can be achieved upon maintenance or replacement of the electrode apparatuses in the ion implantation system 100.

Figures 3, 4:
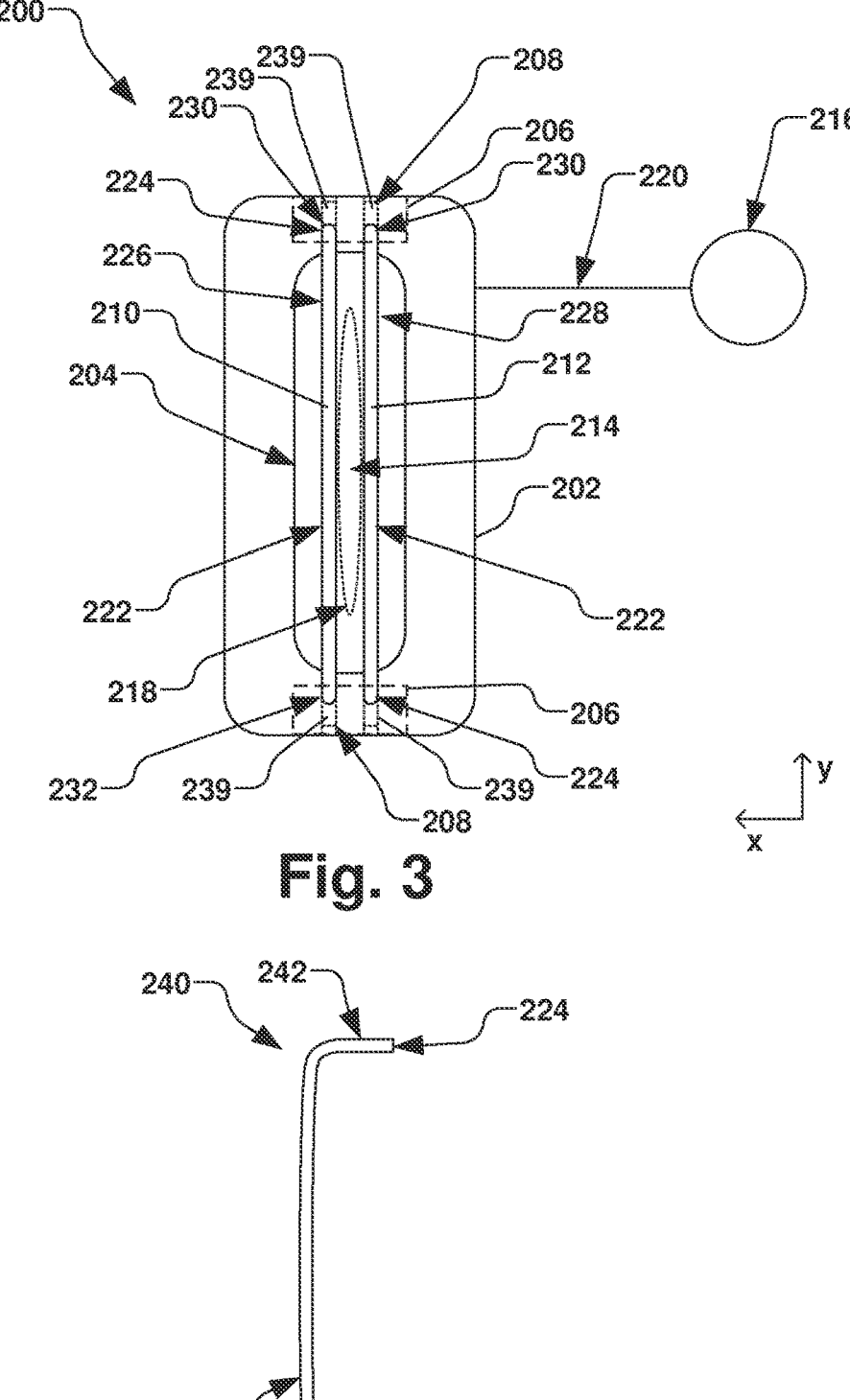
FIG. 3 illustrates a front plan view of an electrode apparatus according to various examples of the present disclosure.
FIG. 4 illustrates a side view of an electrode rod according to various examples of the present disclosure.

In accordance with various aspects of the present disclosure, FIG. 3 illustrates a generalized example of an electrode apparatus 200 that can be configured for use in the ion implantation system 100 of FIG. 2. The electrode apparatus 200 of FIG. 3, for example, can be implemented in one or more of the extraction electrodes 132, AEF electrodes 146, or other electrodes of the ion implantation system 100 of FIG. 2 in accordance with the present disclosure.

The electrode apparatus 200 of FIG. 3, for example, comprises a base plate 202, wherein the base plate is comprised of one or more of a refractory metal and graphite, such as one of tungsten (W), tantalum (Ta), molybdenum (Mo) or graphite. In the present example, the base plate 202 comprises a base plate aperture 204 defined therein. It should be noted that the base plate aperture 204 can be of any size or shape, and is not to be limited to the examples provided in the examples provided in the present disclosure. The base plate 202, for example, further comprises at least one securement region 206, whereby a securement apparatus 208 is associated with the at least one securement region.

In one example, a first electrode rod 210 and a second electrode rod 212 are selectively coupled to the base plate 202 via the securement apparatus 208, whereby the securement apparatus selectively fixes a position of the first and second electrode rods with respect to the base plate 202. It shall be noted that while the present example discusses a first electrode rod 210 and a second electrode rod 212, various embodiments of the present disclosure are contemplated in which only one of the first electrode rod or second electrode rod are selectively coupled to the base plate 202. In another alternatively, additional electrode rods (not shown) may be selectively coupled to the base plate 202 in addition to the first and second electrode rods 210, 212.

In yet another alternative, while not shown, it shall be understood that any number of base plates may be provided, whereby any number of electrode rods (e.g., one or more electrode rods) may be selectively coupled to the any number of base plates. Accordingly, the electrode rod(s) of the present disclosure can be configured to extract, accelerate, decelerate, bend, or focus a charged particle or otherwise control or modify a trajectory thereof in one or more dimensions, as well as prevent the charged particle from passing through or by the electrode rod(s).

The first and second electrode rods 210, 212, for example, are formed from one or more of a refractory metal and graphite. For example, the first and second electrode rods 210, 212 are comprised of one of tungsten (W), tantalum (Ta), molybdenum (Mo) or graphite, whereby the first and second electrode rods are formed, extruded, machined, bent, and/or cast to a predetermined shape. In one particular example, the first and second electrode rods 210, 212 are advantageously formed from wire stock (e.g., tungsten wire), whereby a cost of production of the first and second electrode rods is significantly reduced compared to the manufacture of conventional optics formed from solid plates.

The first and second electrode rods 210, 212, for example, are generally rigid and configured to maintain their respective predetermined shapes during normal maintenance and operation of the electrode apparatus 200. For example, the first and second electrode rods 210, 212 have a cross-section that is sufficient, based on the material selected for their composition, to resist deformation and to maintain their respective predetermined shapes when shipped, stored, installed or used for operation of the electrode apparatus 200. In one non-limiting example, the first and second electrode rods 210, 212 are circular in cross section and have a diameter that can range from approximately 1 mm to approximately 10 mm, whereby the selection of diameter and shape of the electrode rods can be based on the particular application and/or environment in which the electrode rods are implemented. A circular cross section of the electrode rods having a diameter of approximately 4 mm, for example, has been found to be sufficiently sturdy in order to maintain a predetermined shape while providing sufficient production performance.

The first and second electrode rods 210, 212, for example, have a predetermined shape to define an optical region 214 therebetween, as will be discussed in greater detail infra. The optical region 214 in the present example is associated with the base plate aperture 204, whereby an electrical potential 216 applied to the first and second electrode rods 210, 212 is configured to generally define a path, shape, or focus of an ion beam 218 (e.g., a plurality of charged particles) passing between the first and second electrode rods. The path, shape, or focus of the ion beam 218, for example, is based on the electrical potential 216 and the position and predetermined shape of the first and second electrode rods 210, 212.

The first and second electrode rods 210, 212, for example, are generally positioned upstream of the base plate 202, such that the optical region 214 of the first and second electrode rods generally prevents exposure of the base plate to the ion beam 218, thus generally directing any wear to the first and second electrode rods, rather than the base plate. The first and second electrode rods 210, 212 and the optics associated therewith generally define the size and shape of the ion beam 218 for transport efficiency. As such, when the first and second electrode rods 210, 212 wear over time due to beam strike from the ion beam 218, the first and second electrode rods can be inexpensively replaced, while the base plate 202, being subjected to minimal wear, can be used repeatedly with relatively minor cleaning or maintenance.

The electrical potential 216, for example, can comprise, or be associated with, the extraction power supply 126 ($V_{Ex}$) of FIG. 2, an electrical ground, or other voltage source associated with the electrode apparatus 200. An electrical coupling 220 of FIG. 3, for example, electrically couples the first and second electrode rods 210, 212 to the electrical potential 216. The electrical coupling 220, for example, can comprise wiring or other electrical conduit electrically coupled to first and second electrode rods 210, 212, such as a connection through the securement apparatus 208 and base plate 202.

Each of the first and second electrode rods 210, 212, for example, respectively comprise an optical portion 222 and one or more mounting portions 224, wherein the securement apparatus 208 selectively engages the one or more mounting portions to locate the optical portion of each of the first and second electrode rods at a respective predetermined position 226, 228 with respect to the base plate 202. The securement apparatus 208, for example, positions the first and second electrode rods 210, 212 such that at least the optical portions 222 of the first and second electrical rods are parallel to one another when viewed along the path of the ion beam 218. The one or more mounting portions 224 of the first and second electrode rods 210, 212, for example, are further associated with a respective first end 230 and a second end 232 of each of the first and second electrode rods. The securement apparatus 208, for example, can comprise one or more fasteners 239 (e.g., one or more screws) in threaded engagement with the base plate 202 and configured to maintain the position of the first and second electrode rods 210, 212 with respect to the base plate.

FIG. 4 illustrates an electrode rod 240, which can be considered as a representative example of one or more of the first and second electrode rods 210, 212 of FIG. 3. It should be noted that the configuration of the electrode rod 240 is provided as just one example, and that various other shapes or configurations of the electrode rod are also contemplated as falling within the scope of the present disclosure. Further, it is noted that in one example, the first and second electrode rods 210, 212 are identical, but in other examples, the shapes of the first and second electrode rods can differ from one another, based on a desired shaping, focusing, steering, or other characteristic of the ion beam 218.

As illustrated in FIG. 4, the mounting portions 224 of the electrode rod 240 comprise a respective elongate leg portion 242, 244 extending from the optical portion 222 of the electrode rod. The optical portion 222 of electrode rod 240 in the present example is curvilinear, whereby a focusing or shaping of the ion beam 218 of FIG. 3 can be achieved based, at least in part, on the shape of the optical portion of the electrode rod. Further, it is noted that a length of the respective elongate leg portions 242, 244 and radius or shaping of the optical portion 222 can be tailored to provide a desired gas conductance associated with the shape and/or position of the electrode rod 240 with respect to the base plate 202 of FIG. 3 or other components of the ion implantation system 100 of FIG. 2, as will be further discussed infra.

For example, FIGS. 5-6 illustrate example extraction optics 300 comprising a suppression electrode apparatus 302 and a ground electrode apparatus 304 whereby various aspects of the present disclosure can be further appreciated. The suppression electrode apparatus 302 and ground electrode apparatus 304, for example, each comprise a respective electrode apparatus 200 that is respectively configured to form, shape, or guide the ion beam 114 extracted from the ion source 120 of FIG. 2, and whereby the suppression electrode apparatus and ground electrode apparatus generally act as a lens and define the extraction electrode optics 134 described above.

In cross section 306 shown in FIG. 6, for example, the suppression electrode apparatus 302 is configured to repel or suppresses high energy electrons back toward the extraction aperture 130 of the plasma chamber 128 of the ion source 120 to substantially prohibit such high energy electrons from proceeding along the beamline 148 of the ion beam 114. In one example, suppression electrode rods 308, 310 are coupled to suppression base plate 312 of the suppression electrode apparatus 302, whereby the suppression electrode rods 308, 310 are radiused for optical matching to the extraction aperture 130. For example, a curvilinear suppression profile 314 is provided in the suppression electrode rods 308, 310 when viewed perpendicular to the beamline 148 (e.g., along the x-axis), to generally conform with a contour of the extraction aperture 130 of the ion source. Accordingly, the suppression electrode rods 308, 310 act as a lens and focus or steer the ion beam 114 in the vertical (y) direction.

For example, a front suppression surface 316 of the suppression base plate 312 of the suppression electrode apparatus 302 faces upstream toward the extraction aperture 130 of the plasma chamber 128 of the ion source. The curvilinear suppression profile 314 of the suppression electrode rods 308, 310, for example, is configured for optical matching to the extraction aperture 130, whereby the curvilinear suppression profile generally conforms to a contour 318 of the extraction aperture. Further, a shape of the ion beam 114 is controllable via a shape of the suppression electrode rods 308, 310 and the lens effect associated with said shape.

Figure 7:
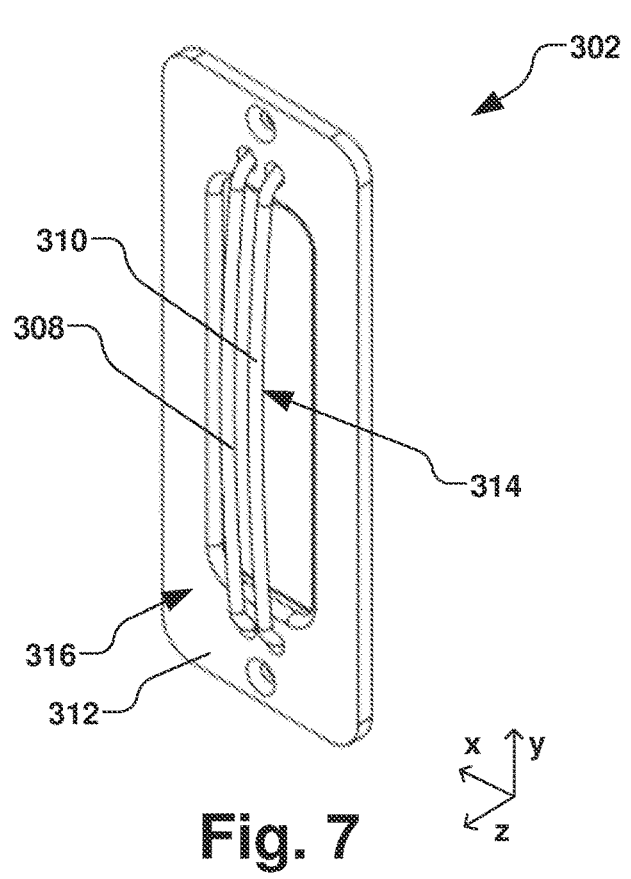
FIG. 7 illustrates a front perspective view of a suppression electrode apparatus according to various examples of the present disclosure.

The suppression electrode rods 308, 310, as shown in FIG. 7, for example, extend proud of the front suppression surface 316. Accordingly, a lower pressure can be further attained between the suppression base plate 312 of the suppression electrode apparatus 302 and the extraction aperture 130 shown in FIG. 6, as compared to conventional suppression plates. As such, the present disclosure provides a lower likelihood of an electrical discharge from the significantly different voltages between the extraction aperture 130 and the suppression base plate 312. With a lower pressure, a lower likelihood of discharge is achieved based on Paschen's curve.

Figure 8:
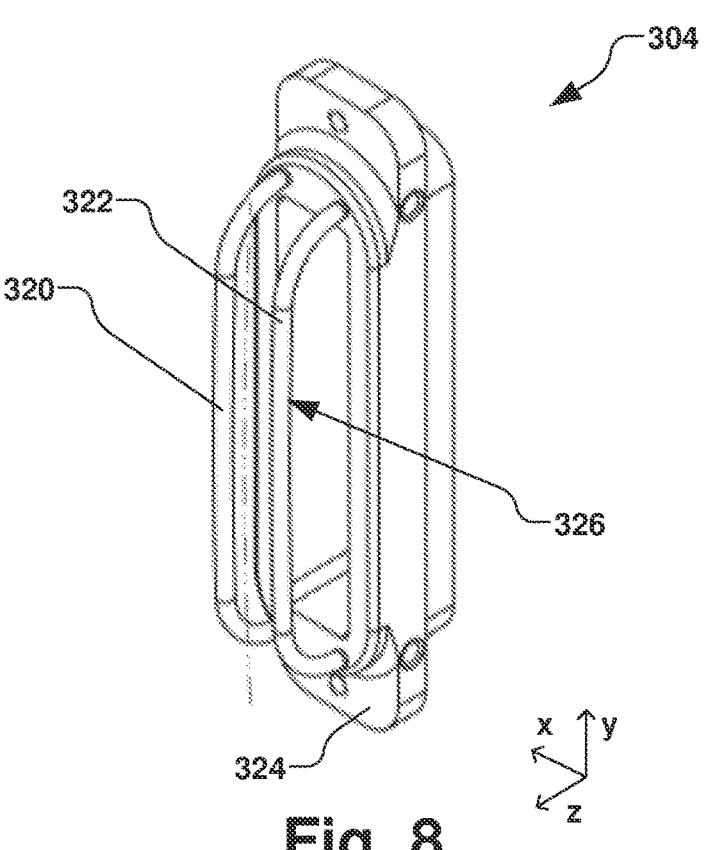
FIG. 8 illustrates a front perspective view of a ground electrode apparatus according to various examples of the present disclosure.

Similarly, ground electrode rods 320, 322 illustrated in FIG. 8, for example, are coupled to a ground base plate 324 of the ground electrode apparatus 304, whereby the ground electrode rods are radiused for optical matching to the suppression electrode apparatus 302. For example, a curvilinear ground profile 326 is provided in the ground electrode rods 320, 322 when viewed perpendicular to the beamline 148 shown in FIG. 5 to generally conform with a contour of the suppression electrode rods 308, 310 while also extending proud of a front surface 328 of the ground base plate 324 illustrated in FIG. 6.

Accordingly, the ground electrode rods 320, 322 of FIG. 8 further act as a lens and focus or steer the ion beam 114 in the vertical (y) direction, while again attaining a lower pressure between the suppression electrode apparatus 302 and the ground electrode apparatus 304 of FIG. 6, thus again decreasing a likelihood of an electrical discharge from the significantly different voltages between the suppression electrode apparatus and ground electrode apparatus. While note shown, one or more electrical insulators, for example, can be provided between the suppression base plate 312 and the ground base plate 324 of FIG. 6 to further limit a likelihood of electrical discharge therebetween. For example, a gap region 330 between the extraction aperture 130 and the suppression base plate 312 and ground base plate 324 is extended, thus also lowering the pressure in the gap region. Accordingly, lengths, geometries, and configurations of the suppression electrode apparatus 302 and the ground electrode apparatus 304 can be selected to optimize the desired optics and pressure in the gap region 330, thus optimizing a mean free path of gases in the region and limiting undesirable ionization of the gases, which could otherwise lead to premature failure of the system.

Figure 9:
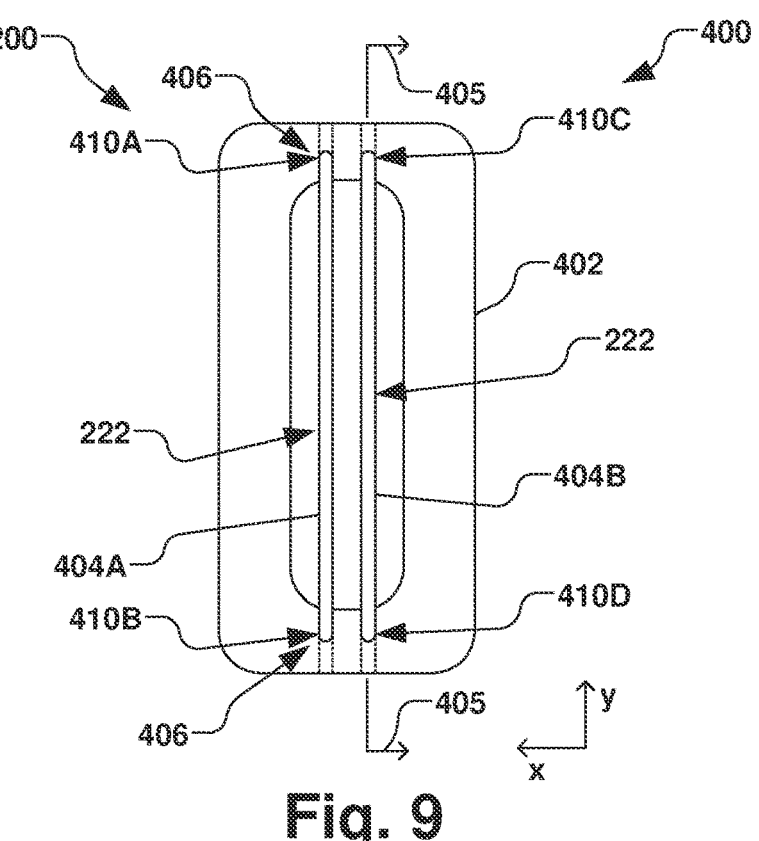
FIG. 9 illustrates a front plan view of a suppression electrode apparatus according to various examples of the present disclosure.
Figure 10:
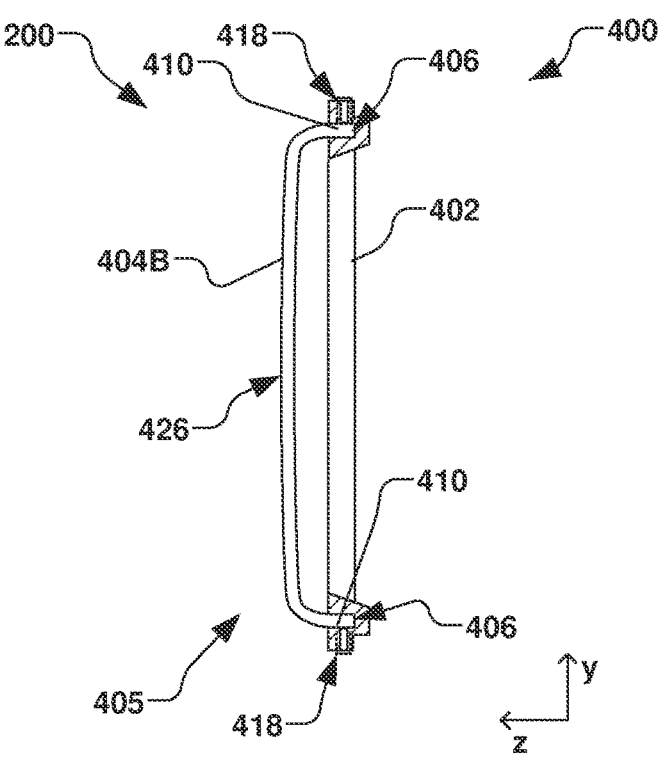
FIG. 10 illustrates a cross-sectional side view of the suppression electrode apparatus of FIG. 9 in accordance with various examples of the present disclosure.

In accordance with one example aspect of the present disclosure, an electrode apparatus 400 is illustrated in FIGS. 9-10. In the present example, the electrode apparatus 400 can be configured as the suppression electrode apparatus 302 of FIGS. 5-6. The electrode apparatus 400 of FIGS. 9-10, for example, comprises a base plate 402 and a pair of electrode rods 404A, 404B, whereby a cross section 405 of the electrode apparatus is illustrated in FIG. 10. In the present example, the pair of electrode rods 404A, 404B of FIG. 9 are substantially identical. However, it is to be appreciated that in other examples, the pair of electrode rods 404A, 404B can have differing shapes from one another based on desired optical characteristics to be achieved by the electrode apparatus 400. Further, while a pair of electrode rods 404A, 404B are described, any number of a plurality of electrode rods are contemplated as falling within the scope of the present disclosure.

As one example, the base plate 402 comprises at least one securement region 406 for operatively coupling the pair of electrode rods 404A, 404B to the base plate. As illustrated in FIG. 11, for example, respective base holes 408A-408D are associated with each respective elongate leg portion 410A-410D of the electrode rods 404A, 404B of FIG. 9. The base holes 408A-408D of FIG. 11, for example, each comprise a blind hole 412 having a predetermined depth 414, as illustrated in cross-section 415 shown in FIG. 12. Generally speaking, each base hole 408, for example, is configured to respectively receive the respective elongate leg portion 410 of the respective electrode rod 404 shown in FIG. 13. In the present example, a predetermined length 416 of each elongate leg portion the elongate leg portions 410 of each electrode rod 404 are configured to be fully inserted into the predetermined depth 414 of the respective base hole 408 of FIGS. 11-12, such that an engagement of the elongate leg portions with the base holes provides accurate and reproducible positioning of the respective electrode rod 404.

As illustrated in FIG. 12, a securement apparatus 418 is configured to respectively selectively secure a mounting portion 420 (e.g., the elongate leg portion 410 of FIG. 13) of the electrode rod 404 to the base plate 402. In some examples, one or more securement apparatuses 418 are provided to selectively secure at least one elongate leg portion 410 of the respective electrode rod 404 of FIG. 13 to the base plate 402. For example, each elongate leg portion 410 of the respective electrode rods 404 may be selectively secured to the base plate via a respective securement apparatus 418. In other examples, fewer securement apparatuses 418 may be utilized, such as one securement apparatus per electrode rod 404, provided that the securement apparatus 418 adequately and fixedly secures the electrode rod to the base plate 402. The securement apparatus 418, for example, can comprise an electrode fastener 422, such as one or more a set screws, whereby the electrode fastener selectively fixedly couples the electrode rod 404 to the base plate 402 via engagement with a threaded hole 424 in a sidewall 426 of the base plate. Accordingly, the optical portion 222 of electrode rods 404A, 404B of FIG. 9 can accurately and repeatably positioned, while further providing for expedient replacement of the electrode rods in association with maintenance, thereof.

Figure 14:
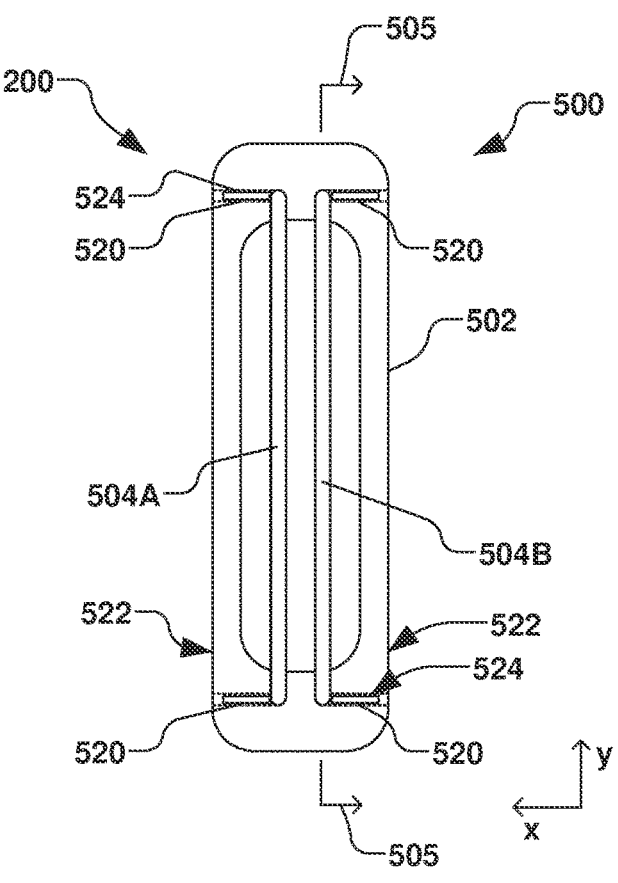
FIG. 14 illustrates a front plan view of a ground electrode apparatus according to various examples of the present disclosure.
Figure 15:
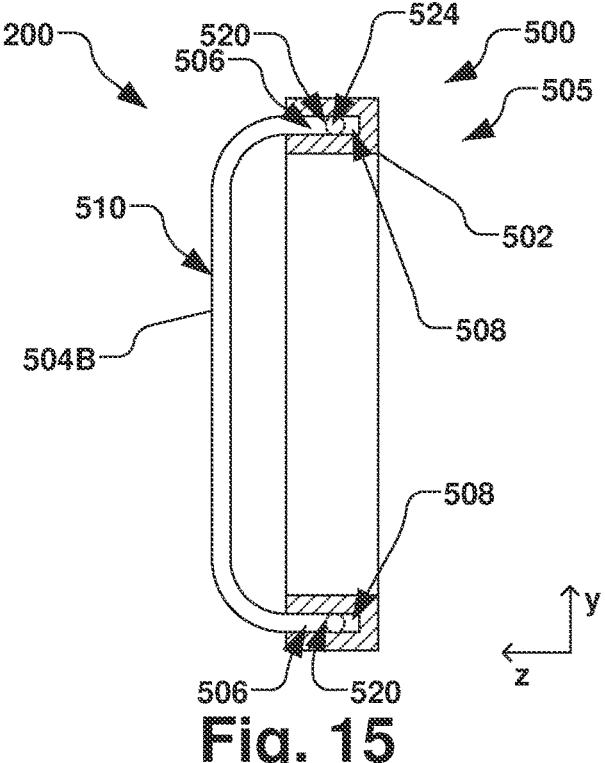
FIG. 15 illustrates a cross-sectional side view of the ground electrode apparatus of FIG. 14 in accordance with various examples of the present disclosure.

FIG. 14 illustrates an electrode apparatus 500 in accordance with another example, whereby the electrode apparatus can be configured as the ground electrode apparatus 304 of FIGS. 7-8. The electrode apparatus 500 of FIGS. 14, for example, comprises a base plate 502 and a pair of electrode rods 504A, 504B, whereby a cross section 505 of the electrode apparatus is illustrated in FIG. 15. A mounting portion 506 of the electrode rod 504B, for example, comprises elongate leg portions 508, whereby the elongate leg portions can extend an optical portion 510 of the electrode rod further from the base plate 502. Accordingly, in one example, desired optics can be attained by positioning the optical portion 510 closer to the extraction aperture 130 shown in FIG. 6, thus provide the ability to position the base plate 502 further from the extraction aperture than conventional systems. Furthermore, in addition to cost savings associated with the manufacture of the suppression electrode rods 310 and ground electrode rods 322, the present disclosure further allows for a variation in a spacing from the extraction aperture 130.

It is to be appreciated that the present disclosure contemplates various shapes of the various electrode rods disclosed herein, as well as the selective coupling of the electrode rods to the various base plates. For example, as illustrated in FIG. 15, threaded holes 520 are provided through side walls 522 of the base plate 502 for engagement with electrode fasteners 524 (e.g., one or more screws). As illustrated in FIG. 11-12, threaded holes 424 are provided in the sidewall 426 of the base plate 402. Alternatively, while note shown, the threaded holes can be provided on a front face or back face of the base plate.

Figure 16:
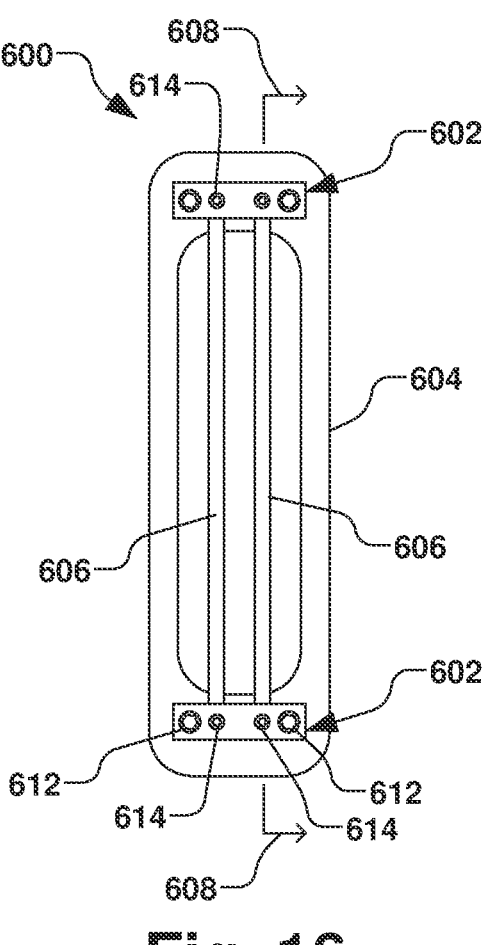
FIG. 16 illustrates a front plan view of another electrode apparatus according to various examples of the present disclosure.

In yet another example, as illustrated in FIG. 16, an electrode apparatus 600 is provided, whereby one or more mount members 602 are selectively coupled to a base plate 604 for selective positioning of electrode rods 606 with respect to the base plate. The electrode apparatus 600 is illustrated in cross-section 608 shown in FIG. 17, whereby the one or more mount members 602 selectively fixedly position the electrode rods 606 with respect to the base plate 604. The one or more mount members 602, for example, can comprise one or more thru-holes 610, as illustrated in FIG. 18, whereby one or more respective clamp screws 612 illustrated in FIG. 17 selectively secure the one or more mount members to threaded holes (not shown) in the base plate 604.

Further, the electrode rods 606 are selectively fixedly coupled to the one more mount members 602 via one or more electrode fasteners 614, such as one or more a set screws in a manner similar to that discussed above. For example, the one or more electrode fasteners 614 threadedly engage respective threaded holes 616 in the one more mount members 602. Accordingly, an electrode rod assembly 618 can be provided, whereby the electrode rods 606 are pre-positioned with respect to the one or more mount members 602, as illustrated in FIG. 18. As such, the electrode rod assembly 618 can provide for replacement of the electrode rods 606 by replacing the electrode rod assembly as a unit, whereby the electrode rods are pre-positioned with respect to the one or more mount members, thus allowing for quick, inexpensive, and accurate maintenance of the electrode apparatus.

Figure 17:
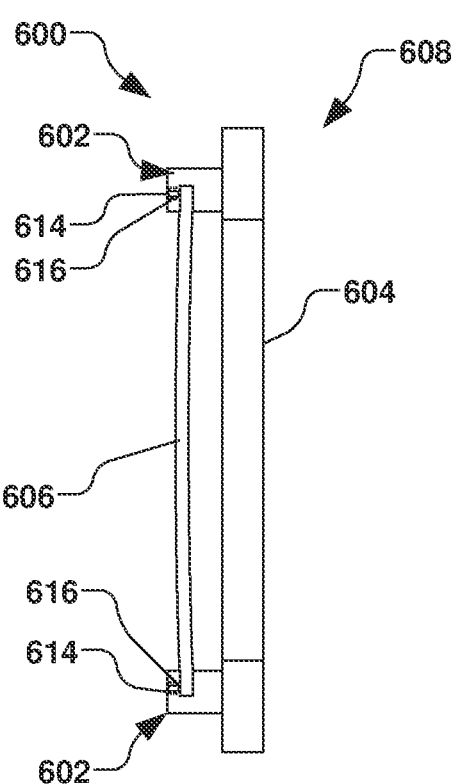
FIG. 17 illustrates a cross-sectional side view of the extraction electrode apparatus of FIG. 16 in accordance with various examples of the present disclosure.

Accordingly, the electrode rods 606 can be secured to the one or more mount members 602 in a predetermined orientation prior to being coupled to the base plate, whereby the one or more mount members provide a simple and precise positioning of the electrode rods with respect to the base plate 604 of FIGS. 16-17. As such, the electrode rods 606 and one or more mount members 602 can be pre-configured to quick coupling of the electrode rod assembly 618 to the base plate 604 in a precise and repeatable manner.

Figure 18:
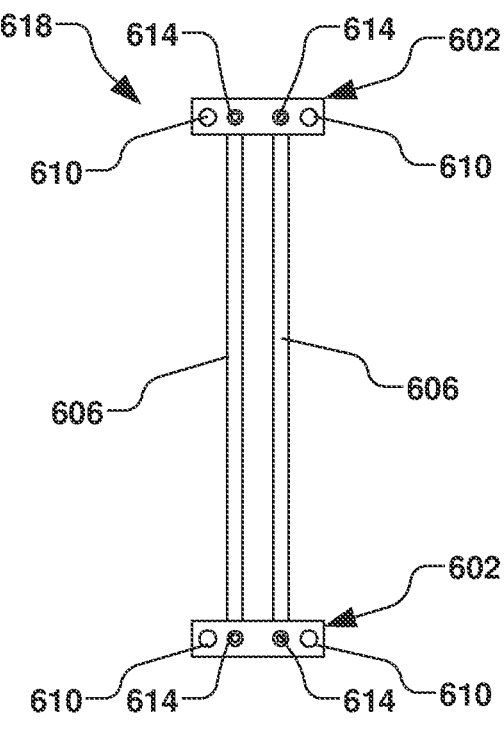
FIG. 18 illustrates a front plan view of an electrode rod assembly according to various examples of the present disclosure.
Figure 19:
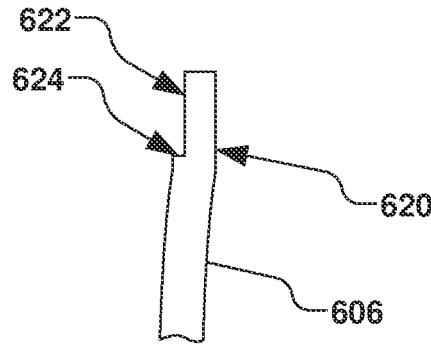
FIG. 19 illustrates a side view of a portion of an electrode rod according to various examples of the present disclosure.

As illustrated in FIG. 19, in accordance with another example, an elongate leg portion 620 of the electrode rod 606, whereby one or more positioning flats 622, 624 is provided for accurate positioning of the electrode rod, such as with respect to the one or more mount members 602 of FIG. 18. The one or more positioning flats 622, 624 for example, positions the electrode rod 606 in a predetermined position such that the electrode rod does not rotate and remains in the predetermined position regardless of heating and cooling of the electrode rod and/or base plate 604. The present disclosure further appreciates that the positioning flats 622, 624 may be provided in conjunction with any of the aforementioned electrode rods with respect to the base plates.

Figures 20, 21:
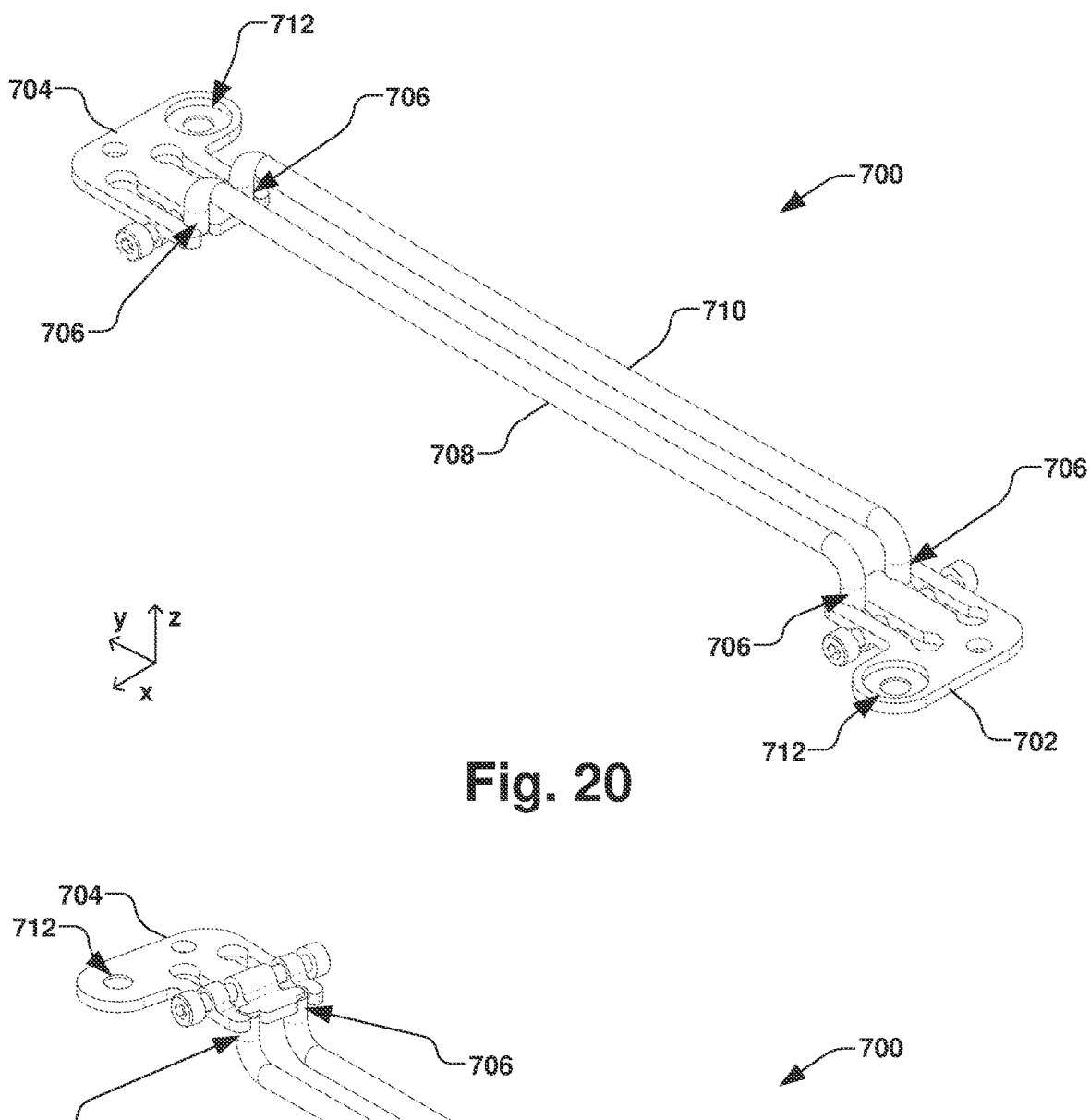
FIG. 20 illustrates a top front perspective view of another electrode apparatus according to various examples of the present disclosure.
FIG. 21 illustrates a bottom front perspective view of the electrode apparatus of FIG. 20 according to various examples of the present disclosure.

In yet another example aspect of the disclosure, FIGS. 20-21 illustrate several views of another electrode apparatus 700, whereby a first clamp member 702 and a second clamp member 704 are configured to selectively secure respective mounting portions 706 of a first electrode rod 708 and a second electrode rod 710 thereto. The first electrode rod 708 and second electrode rod 710, for example, may have a configuration similar to the electrode rod 240 illustrated in FIG. 4.

Figures 22, 23:
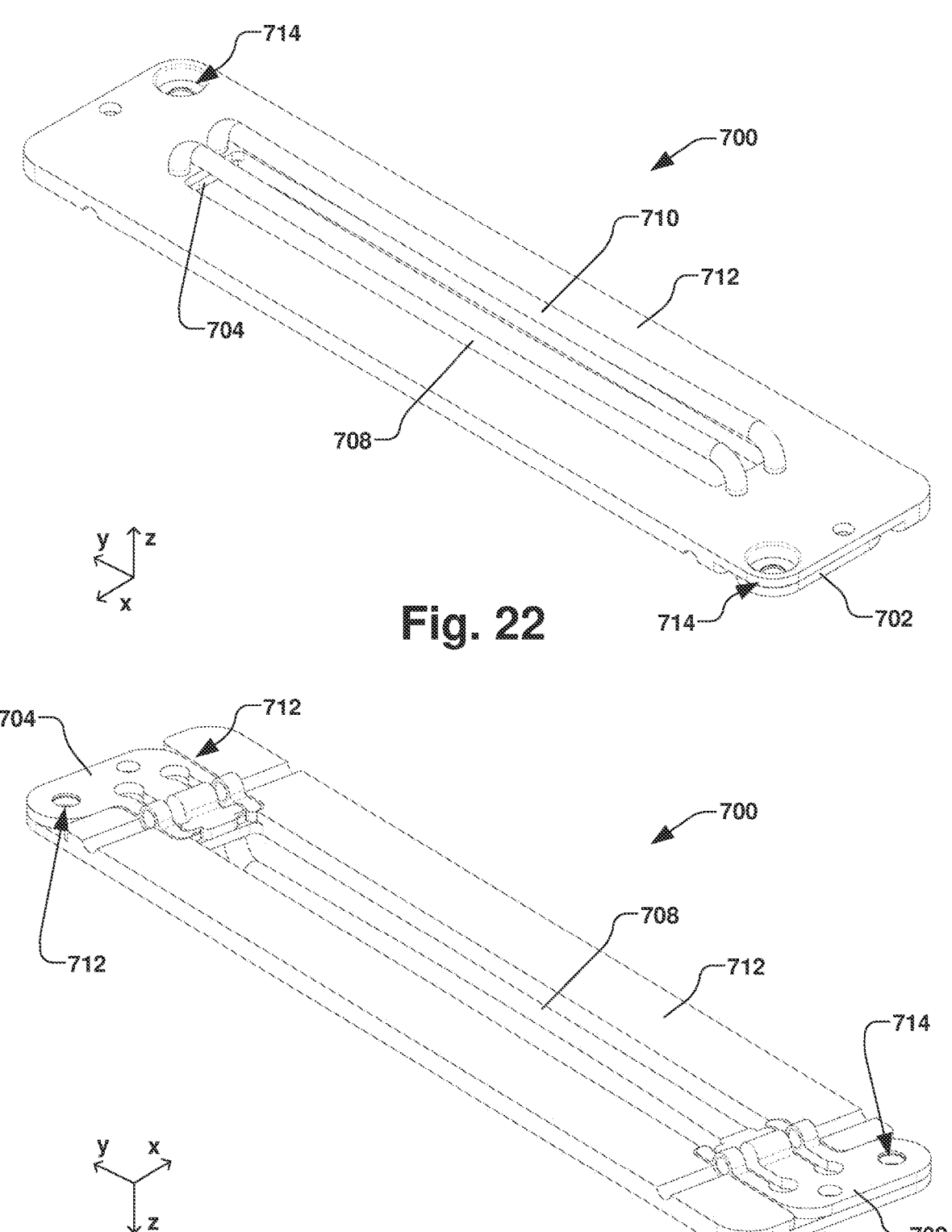
FIG. 22 illustrates a top front perspective view of an electrode apparatus associated with a base plate according to various examples of the present disclosure.
FIG. 23 illustrates a bottom front perspective view of the electrode apparatus of FIG. 22 according to various examples of the present disclosure.

In another example shown in FIGS. 22-23, the first clamp member 702 and second clamp member 704 are further illustrated, wherein the first and second clamp members may be selectively coupled or fastened to a base plate 712, such as via one or more screws or fasteners (not shown) associated with one or more plate engagement regions 714. Accordingly, the electrode apparatus 700 is further configured to selectively fixedly position the first electrode rod 708 and second electrode rod 710 with respect to the base plate 712.

In the present example, the first clamp member 702 and second clamp member 704 are generally identical to one another, wherein the first electrode rod 708 and second electrode rod 710 of FIGS. 20-23 are further identical to one another. As such, various efficiencies in the manufacture and implementation of said components can be advantageously achieved. It should be noted, however, that while not shown, other configurations are contemplated, such as the first clamp member 702 and second clamp member being mirror images of one another, or being otherwise distinct from one another. Similarly, while not shown, the first electrode rod 708 and second electrode rod 710 may have differing configurations from one another.

Figure 24:
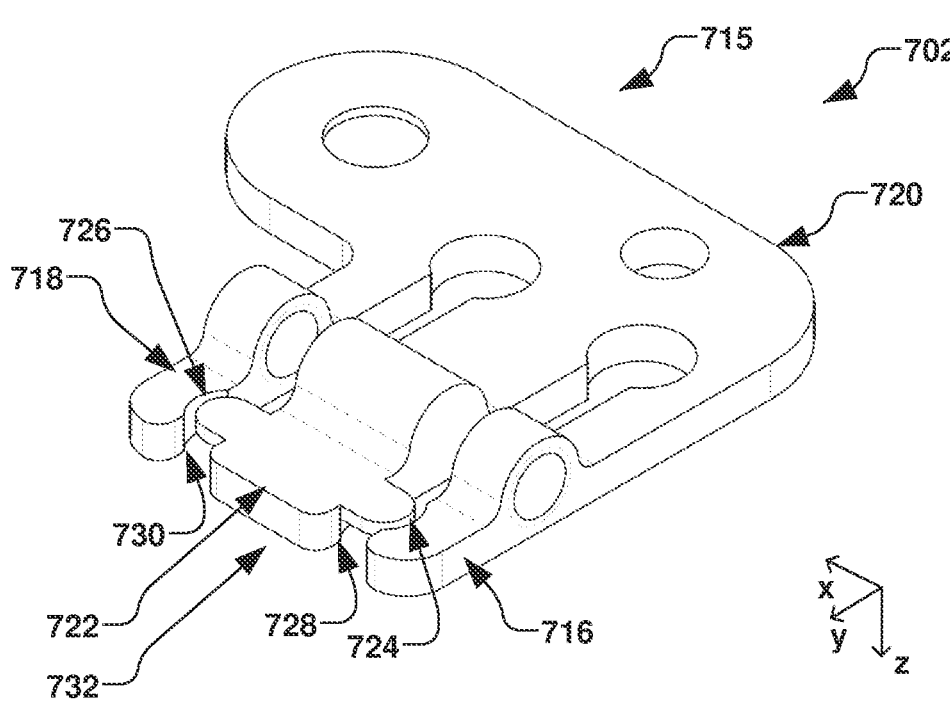
FIG. 24 illustrates a bottom side perspective view of a clamp member according to various examples of the present disclosure.

In accordance with one example, the first clamp member 702 is illustrated in greater detail in FIG. 24, and is generically referred to as clamp member 715, whereby the clamp member 715 can be considered as further illustrative of either of the first clamp member and the second clamp member 704 of FIGS. 20-23. As shown in FIG. 24, the clamp member 715, for example, comprises a first cantilevered member 716 and a second cantilevered member 718 extending from a base portion 720 of the first clamp member. A central member 722 of the clamp member 715, for example, further extends from the base portion 720, whereby a first gap 724 and a second gap 726 are respectively defined between the central member 722 and the respective first cantilevered member 716 and second cantilevered member 718.

The clamp member 715, for example, further comprises a first engagement portion 728 and a second engagement portion 730 respectively associated with each of the first electrode rod 708 and second electrode rod 710 of FIGS. 20-23. As illustrated in greater detail in FIG. 25, the first engagement portion 728 is configured to selectively engage the mounting portion 706 of the first electrode rod 708, and the second engagement portion 730 is configured to selectively engage the mounting portion of the second electrode rod (not shown in FIG. 25 for clarity). The mounting portion 706 (shown with respect to the first electrode rod 708 in FIG. 25), for example, has a rod diameter 732 associated therewith, whereby an engagement diameter 734 associated with each of the first engagement portion 728 and second engagement portion 730 is configured to contact and selectively secure the respective first electrode rod and second electrode rod (not shown) to the clamp member 702. As such, the first cantilevered member 716, second cantilevered member 718, and the central member 722 generally define a securement apparatus 736 configured to selectively secure the first electrode rod 708 and second electrode rod 710 with respect to the clamp member 702 in a securement region 737.

Figure 26:
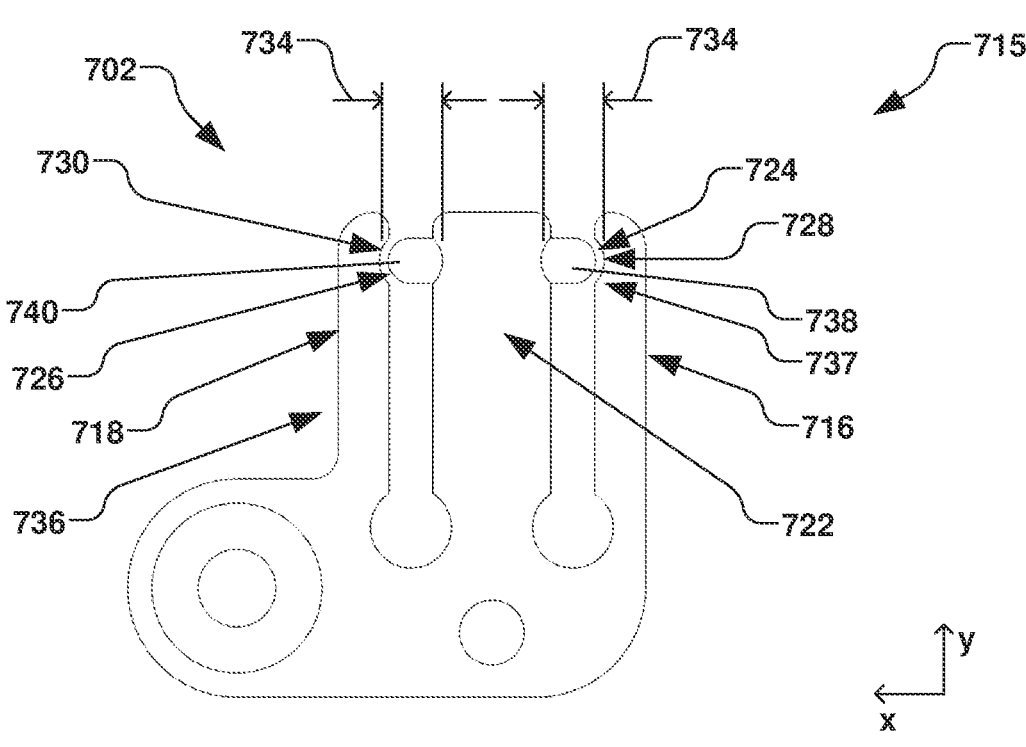
FIG. 26 illustrates top plan view of a clamp member without electrode rods according to various examples of the present disclosure.
Figure 27:
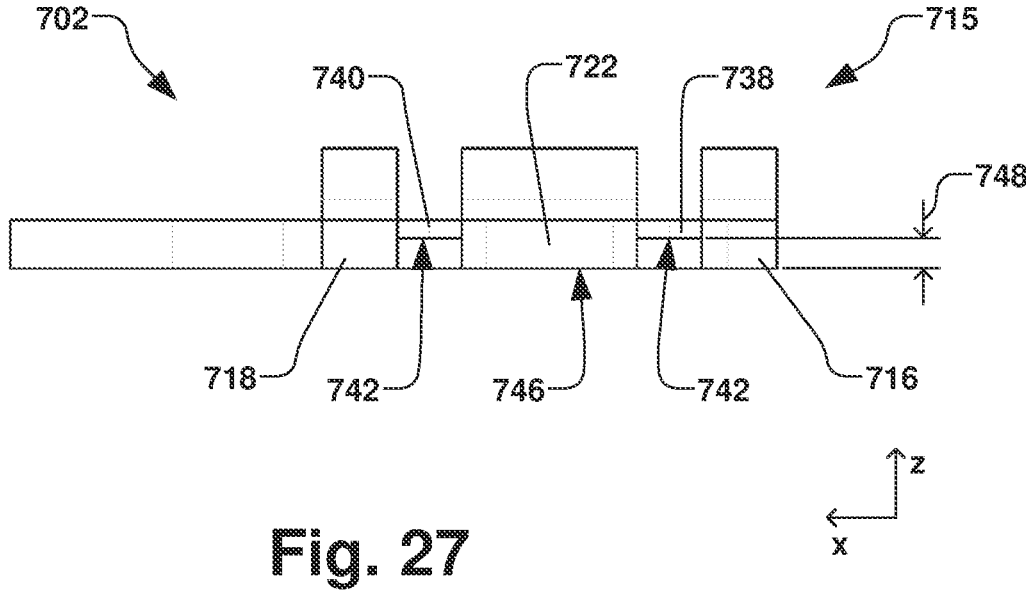
FIG. 27 illustrates front side view of the clamp member of FIG. 26 according to various examples of the present disclosure.
Figure 28:
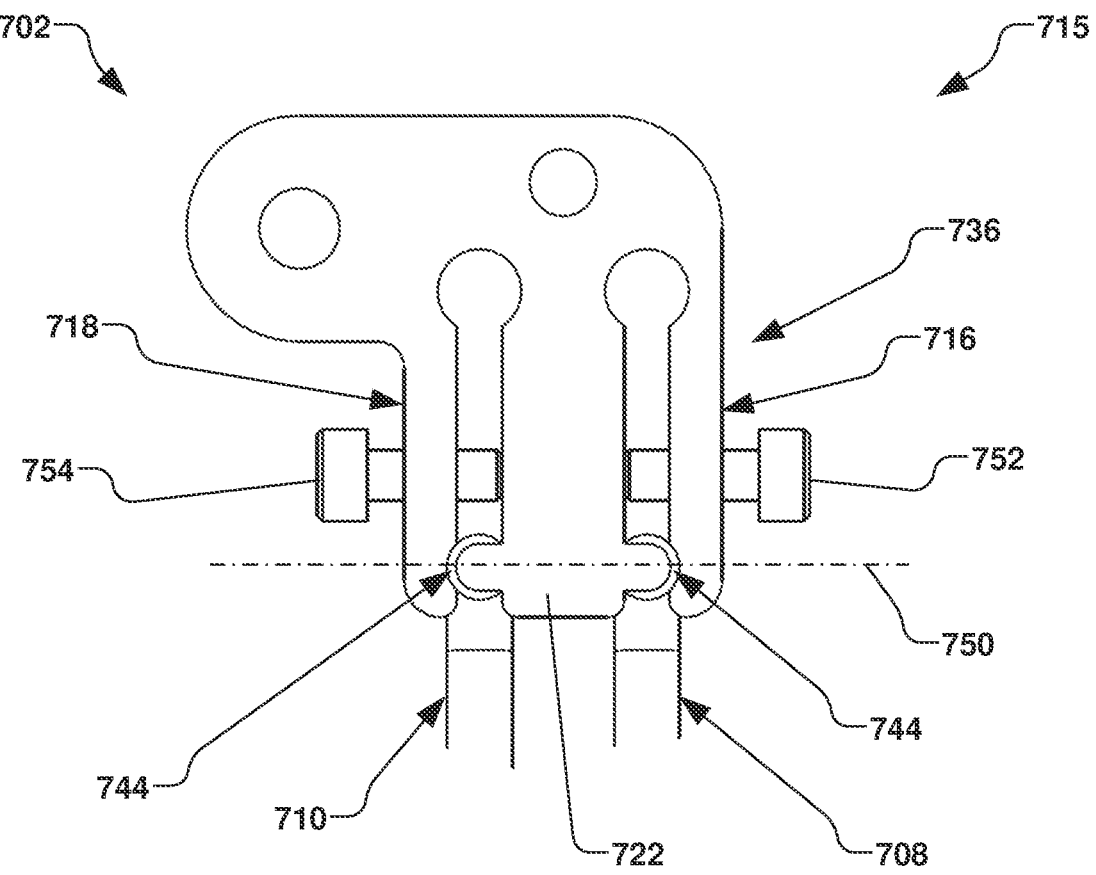
FIG. 28 illustrates bottom plan view of a clamp member with electrode rods according to various examples of the present disclosure.

FIG. 26 illustrates the clamp member 702, alone, whereby the engagement diameter 734 of each of the first engagement portion 728 and second engagement portion 730 is shown in greater detail. The securement apparatus 736, for example, further comprises a first stop member 738 and a second stop member 740 associated with the respective first cantilevered member 716 and second cantilevered member 718, whereby a stop surface 742 illustrated in FIG. 27 is associated with each of first stop member and second stop member and is configured to respectively selectively contact an end surface 744 of the respective first electrode rod 708 and second electrode rod 710 of as illustrated in FIG. 28. In the present example, the first stop member 738 and second stop member 740 of FIG. 27 are fixed with respect to the central member 722, whereby the stop surface 742 is generally recessed from a top surface 746 of the central member by a recess distance 748. As such, the stop surfaces 742 of the central member 722, in conjunction with the first engagement portion 728 and second engagement portion 730 of the respective first cantilevered member 716 and second cantilevered member 718 are configured to contact and selectively secure the respective first electrode rod 708 and second electrode rod 710 of FIGS. 20-23 to the clamp member 702.

FIG. 28 illustrates another view of the clamp member 702, whereby in the present example, the securement apparatus 736 is further configured to selectively engage one or more of the first cantilevered member 716, second cantilevered member 718, and central member 722 to selectively compress or expand one or more of the first and second cantilevered members toward or away from the central member along a securement axis 750. The selective compression or expansion of the first cantilevered member 716 and second cantilevered member 718 toward or from the central member 722, for example, selectively clamps, secures or otherwise fixes a position of the first electrode rod 708 and second electrode rod 710 to the clamp member 702.

Figure 25:
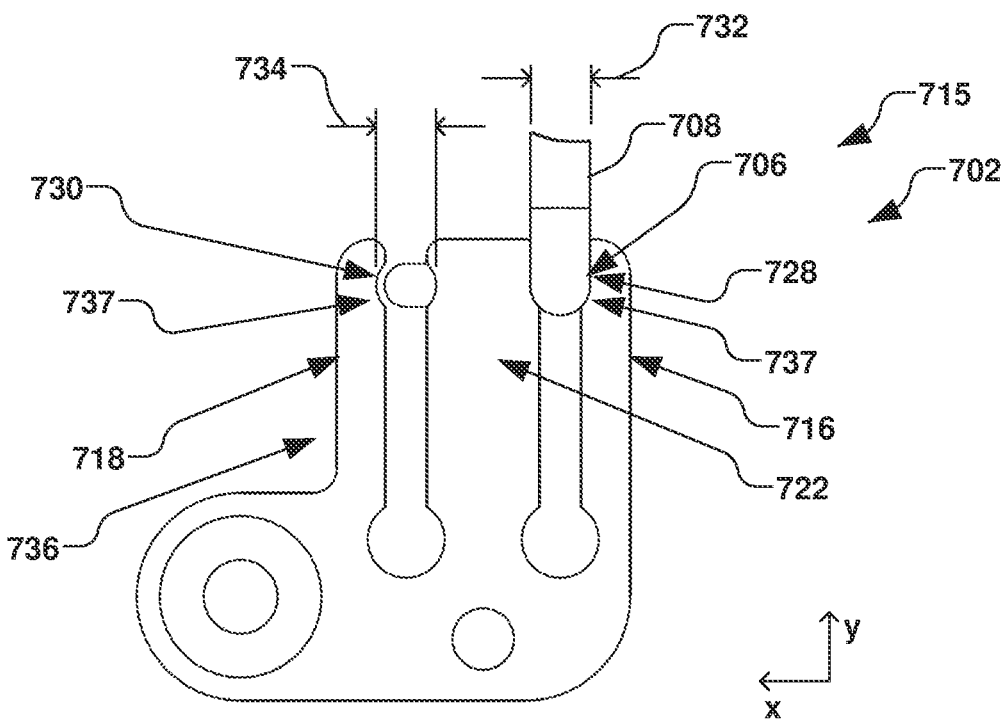
FIG. 25 illustrates top plan view of a clamp member and an electrode rod according to various examples of the present disclosure.

In one example, the first cantilevered member 716 and second cantilevered member 718 are generally resilient, wherein the selective compression of the first cantilevered member 716 and second cantilevered member 718 toward the central member 722 can be attained by a sizing of the engagement diameter 734 with respect to the rod diameter 732 shown in FIGS. 25 and 26. In an arrangement where the engagement diameter 734 is less than the rod diameter 732, the securement apparatus 736, for example, can comprise a first securement screw 752 and a second securement screw 754, whereby the first and second securement screws threadedly engage the respective first cantilevered member 716 and second cantilevered member 718. Accordingly, when the first securement screw 752 and second securement screw 754 are threaded into the respective first cantilevered member 716 and second cantilevered member 718 to abut the central member 722, the respective first cantilevered member and second cantilevered member are configured to resiliently flex and extend from or retract towards the central member based on the threaded engagement therebetween.

Thus, in the present example, a tightening of the first securement screw 752 and second securement screw 754 can cause an expansion of the first cantilevered member 716 and second cantilevered member 718 along the securement axis 750 to allow for insertion of the respective first electrode rod 708 and second electrode rod 710 into the first engagement portion 728 and second engagement portion 730 of the clamp member 702. Further, due to the resiliency of the first cantilevered member 716 and second cantilevered member 718, a loosening of the first securement screw 752 and second securement screw 754 can cause a retraction of the first cantilevered member 716 and second cantilevered member 718 along the securement axis 750 toward one another to selectively retain the respective first electrode rod 708 and second electrode rod 710 in the clamp member 702. Accordingly, the first gap 724 and second gap 726 shown in FIG. 26, for example, is thus selectively controlled to selectively position and secure first electrode rod 708 and second electrode rod 710 of FIG. 28 between the central member 722 and the respective first cantilevered member 716 and second cantilevered member 718.

It shall be noted that the present disclosure contemplates the first securement screw 752 and second securement screw 754 threaddedly engaging the central member 722, and wherein the first cantilevered member 716 and second cantilevered member 718 comprise thru-holes (not shown) through which the first and second securement screws are configured to freely translated and rotate with respect to the securement axis 750. As such, the engagement diameter 734 can be provided as greater than or approximately equal to the rod diameter 732, whereby the first securement screw 752 and second securement screw 754 compress the first cantilevered member 716 and second cantilevered member 718 toward one another along the securement axis 750 upon tightening of the first and second securement screws, thereby selectively retaining the respective first electrode rod 708 and second electrode rod 710 in the clamp member 702.

The present disclosure contemplates the securement apparatus 736 comprising various securement features, and the disclosure is not to be limited by the configuration shown for the first securement screw 752 and second securement screw 754 expanding and compressing the first cantilevered member 716 and second cantilevered member 718 along the securement axis 750. For example, the present disclosure contemplates the securement apparatus 736 comprising various cams, screws, nuts, levers, or other features configured to selectively compress or expand the first cantilevered member 716 and second cantilevered member 718 along the securement axis 750.

The present disclosure thus provides for replacement of the optical components of an electrode with a refractory metal rods or graphite which has been machined or otherwise formed to a rod-like shape so as to reduce the cost of the electrodes. As such, electrodes experiencing wear or buildup can be replaced and/or disposed of after use, thereby preserving desired ion beam transport characteristics while minimizing maintenance and operational costs. Further, by maintaining desired ion beam transport characteristics, the present disclosure provides for a more stable ion beam than conventionally seen, thus increasing implant uniformity and mitigating particle contamination at the workpiece.

It shall be noted that the present disclosure contemplates the electrodes disclosed herein to be applicable in various scenarios where transportation of a charged particle is desired. For example, the present disclosure contemplates the electrodes disclosed herein to be configured to guide, shape, extract, accelerate, decelerate, and/or focus in one or more dimensions any number of charged particles, with particular applicability to an ion beam comprising a plurality of charged particles or ions. The present disclosure further contemplates the electrodes disclosed herein to be configured in some embodiments to prevent charged particles from passing through the electrode(s). For example, various electrodes of the present disclosure are contemplated as being configured to prevent back-streaming of charged particles between two sets of electrodes. In one example, primary and secondary electrodes of opposite polarities can be configured along a path whereby the primary electrode is downstream of the secondary electrode. As such, positive ions or electrons, for example can be generally prevented from back-streaming from the primary electrode to the secondary electrode.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. An electrode apparatus for an ion implantation system, the electrode apparatus comprising:

a base plate having a base plate aperture defined therein, and wherein the base plate comprises at least one securement region;

a securement apparatus associated with each of the at least one securement region;

a plurality of electrode rods selectively fixedly coupled to the base plate via the securement apparatus, wherein the plurality of electrode rods have a predetermined shape to define an optical region therebetween, and wherein the optical region is associated with the base plate aperture, wherein each of the plurality of electrode rods respectively comprise an optical portion and one or more mounting portions, wherein the securement apparatus selectively engages the one or more mounting portions to fixedly locate the optical portion of each of the plurality of electrode rods at a predetermined position with respect to the base plate; and an electrical coupling, wherein the electrical coupling is electrically coupled to the plurality of electrode rods and configured to electrically connect to an electrical potential, and wherein the predetermined shape of the plurality of electrode rods is configured to define a path of an ion beam passing between the plurality of electrode rods based on the electrical potential, wherein the optical portion of each of the plurality of electrode rods has a curvilinear shape with respect to the path of the ion beam and wherein a portion of the one or more mounting portions has a shape that differs from the curvilinear shape.

2. The electrode apparatus of claim 1, wherein the one or more mounting portions are associated with a respective first end and second end of each of the plurality of electrode rods.

3. The electrode apparatus of claim 2, wherein the one or more mounting portions respectively comprise an elongate leg portion extending from the optical portion of each of the plurality of electrode rods.

4. The electrode apparatus of claim 3, wherein the base plate comprises a base hole configured to selectively receive the respective elongate leg portion of each of the plurality of electrode rods, wherein the securement apparatus comprises an electrode fastener associated with at least one elongate leg portion of each electrode rod, respectively, wherein the electrode fastener is configured to selectively secure the respective elongate leg portion to the base plate.

5. The electrode apparatus of claim 4, wherein the electrode fastener comprises a set screw.

6. The electrode apparatus of claim 4, wherein each respective base hole is a blind hole having a predetermined depth, wherein the predetermined depth defines the predetermined position of the optical portion of each of the plurality of electrode rods with respect to the base plate.

7. The electrode apparatus of claim 3, wherein the securement apparatus comprises a mounting plate, wherein the one or more mounting portions of each of the plurality of electrode rods are selectively coupled to the mounting plate, and wherein the mounting plate is selectively coupled to the base plate in the at least one securement region.

8. The electrode apparatus of claim 7, wherein the mounting plate comprises at least one mounting hole configured to respectively selectively receive one of the respective first end and second end of each of the plurality of electrode rods, wherein the securement apparatus comprises an electrode fastener associated with at least one elongate leg portion of each electrode rod, respectively, wherein the electrode fastener is configured to respectively selectively secure at least one elongate leg portion to the mounting plate, respectively, and wherein the securement apparatus further comprises at least one mounting plate fastener configured to selectively secure the mounting plate to the base plate.

9. The electrode apparatus of claim 8, wherein the base plate comprises at least one threaded base hole configured to respectively receive the at least one mounting plate fastener, wherein the at least one mounting plate fastener comprises a screw.

10. The electrode apparatus of claim 9, wherein the electrode fastener comprises a set screw.

11. The electrode apparatus of claim 3, wherein the securement apparatus comprises a clamp member having a central member and one or more cantilevered members separated from the central member by a respective one or more predetermined gaps, wherein the clamp member is configured to selectively control the respective one or more predetermined gaps to selectively position and secure each of the plurality of electrode rods respectively between the one or more cantilevered members and the central member.

12. The electrode apparatus of claim 11, wherein the clamp member further comprises one or more stop members configured to selectively contact the respective first end and second end of each of the plurality of electrode rods, thereby respectively controlling a position of each of the plurality of electrode rods with respect to the clamp member.

13. The electrode apparatus of claim 1, wherein the plurality of electrode rods are parallel to each other when viewed along the path of the ion beam.

14. The electrode apparatus of claim 1, wherein each of the plurality of electrode rods are comprised of one or more of a refractory metal or graphite, and wherein the base plate is comprised of one or more of a refractory metal or graphite.

15. The electrode apparatus of claim 1, wherein the plurality of electrode rods define a suppressor electrode positioned downstream of an extraction aperture of an ion source, wherein the electrical potential is a predetermined non-zero voltage.

16. The electrode apparatus of claim 1, wherein the plurality of electrode rods define a ground electrode, wherein the electrical potential is a source of electrical ground.

17. The electrode apparatus of claim 1, wherein the plurality of electrode rods are comprised of one of tungsten (W), tantalum (Ta), molybdenum (Mo) or graphite.

18. An electrode assembly for controlling an ion beam in an ion implantation system, the electrode assembly comprising:

a base plate comprising at least one securement region;

one or more electrode rods having one or more predetermined shapes, wherein the one or more predetermined shapes comprise a mounting portion and a optical portion associated with a desired characteristic of the ion beam, and wherein the optical portion has a curvilinear shape, with respect to a path of the ion beam, that differs in shape from the mounting portion; and a securement apparatus configured to selectively fixedly couple the one or more electrode rods to the at least one securement region of the base plate, wherein the securement apparatus comprises a clamp member having a central member and one or more cantilevered members separated from the central member by a respective one or more predetermined gaps, wherein the clamp member is configured to selectively control the respective one or more predetermined gaps to selectively position and secure the one or more electrode rods respectively between the one or more cantilevered members and the central member.

19. The electrode assembly of claim 18, wherein the clamp member further comprises one or more stop members configured to selectively contact a respective end of the one or more electrode rods, thereby controlling a position of the one or more electrode rods, respectively.

20. The electrode apparatus of claim 1, wherein the optical portion of each of the plurality of electrode rods generally conforms to a contour of an extraction aperture of an ion source, and wherein the optical portion of each of the plurality of electrode rods is operable to control a shape of the ion beam.

\*    \*    \*    \*    \*